US011139397B2

(12) United States Patent
Lin et al.

(10) Patent No.: US 11,139,397 B2
(45) Date of Patent: Oct. 5, 2021

(54) SELF-ALIGNED METAL COMPOUND LAYERS FOR SEMICONDUCTOR DEVICES

(71) Applicant: Taiwan Semiconductor Manufacturing Co., Ltd., Hsinchu (TW)

(72) Inventors: Cheng-Ming Lin, Kaohsiung (TW); Sai-Hooi Yeong, Zhubei (TW); Ziwei Fang, Hsinchu (TW); Chi On Chui, Hsinchu (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 133 days.

(21) Appl. No.: 16/572,255

(22) Filed: Sep. 16, 2019

(65) Prior Publication Data
US 2021/0083120 A1   Mar. 18, 2021

(51) Int. Cl.
*H01L 29/78* (2006.01)
*H01L 21/02* (2006.01)
*H01L 29/66* (2006.01)

(52) U.S. Cl.
CPC .... *H01L 29/78391* (2014.09); *H01L 21/0228* (2013.01); *H01L 21/02172* (2013.01);
(Continued)

(58) Field of Classification Search
CPC .. C08L 53/00; C08L 53/005; H01L 21/32139; H01L 21/31144;
(Continued)

(56) References Cited

U.S. PATENT DOCUMENTS 7,053,433 B1 *  5/2006  Derbenwick ..... H01L 27/11502
                                                    257/296
8,853,085 B1 * 10/2014  Abdallah ............ H01L 21/0337
                                                    438/694
(Continued)

FOREIGN PATENT DOCUMENTS

TW           465096 B  * 11/2001  .............. H01L 27/11

OTHER PUBLICATIONS

Machine translation, Lung, Taiwanese Pat. Pub. No. TW 465096B, translation date: Mar. 24, 2021, all pages. (Year: 2021).*

*Primary Examiner* — Victoria K. Hall
(74) *Attorney, Agent, or Firm* — Sterne, Kessler, Goldstein & Fox P.L.L.C.

(57) ABSTRACT

The present disclosure relates to methods for forming a semiconductor device. The method includes forming a substrate and forming first and second spacers on the substrate. The method includes depositing first and second self-assembly (SAM) layers respectively on sidewalls of the first and second spacers and depositing a layer stack on the substrate and between and in contact with the first and second SAM layers. Depositing the layer stack includes depositing a ferroelectric layer and removing the first and second SAM layers. The method further includes depositing a metal compound layer on the ferroelectric layer. Portions of the metal compound layer are deposited between the ferroelectric layer and the first or second spacers. The method also includes depositing a gate electrode on the metal compound layer and between the first and second spacers.

20 Claims, 14 Drawing Sheets

(52) U.S. Cl.
CPC .... *H01L 29/6684* (2013.01); *H01L 29/66795* (2013.01); *H01L 29/785* (2013.01)

(58) Field of Classification Search
CPC ......... H01L 21/76802; H01L 21/76816; H01L 29/66553; H01L 29/66545
See application file for complete search history.

(56) References Cited

U.S. PATENT DOCUMENTS

| | | | | |
|---|---|---|---|---|
| 9,437,711 | B2* | 9/2016 | Cai | H01L 29/785 |
| 9,508,562 | B2* | 11/2016 | Xu | H01L 21/76816 |
| 9,633,942 | B1* | 4/2017 | Hosier | H01L 21/76814 |
| 10,038,079 | B1* | 7/2018 | Ohtou | H01L 29/41791 |
| 10,396,176 | B2* | 8/2019 | Clendenning | H01L 29/51 |
| 11,018,256 | B2* | 5/2021 | Lin | H01L 29/6684 |
| 2013/0105918 | A1* | 5/2013 | Mieno | H01L 21/02181 257/410 |
| 2013/0157041 | A1* | 6/2013 | Hsin | C09D 5/00 428/327 |
| 2014/0038428 | A1* | 2/2014 | Huang | H01L 21/0332 438/780 |
| 2014/0312387 | A1* | 10/2014 | Kim | H01L 29/267 257/192 |
| 2015/0024584 | A1* | 1/2015 | Wells | H01L 29/4966 438/589 |
| 2015/0137262 | A1* | 5/2015 | Baek | H01L 27/0207 257/401 |
| 2015/0206963 | A1* | 7/2015 | Ho | H01L 29/4966 257/411 |
| 2015/0214485 | A1* | 7/2015 | Lim | H01L 51/0022 438/34 |
| 2016/0172488 | A1* | 6/2016 | Oh | H01L 21/28088 257/330 |
| 2016/0264814 | A1* | 9/2016 | Lobez Comeras | C01B 32/194 |
| 2016/0270237 | A1* | 9/2016 | Cho | H01L 23/53238 |
| 2016/0336426 | A1* | 11/2016 | Chang | H01L 29/6656 |
| 2017/0141036 | A1* | 5/2017 | Civay | H01L 21/76802 |
| 2017/0154972 | A1* | 6/2017 | Hsieh | H01L 29/66545 |
| 2017/0194423 | A1* | 7/2017 | Lin | H04N 5/23254 |
| 2018/0026039 | A1* | 1/2018 | Chang | H01L 21/823821 257/369 |
| 2018/0187063 | A1* | 7/2018 | Price Hoelscher | C09K 8/36 |
| 2018/0330965 | A1* | 11/2018 | Jiang | H01L 21/3212 |
| 2018/0350950 | A1* | 12/2018 | Wang | H01L 29/66795 |
| 2018/0374927 | A1* | 12/2018 | Liu | H01L 29/66659 |
| 2019/0096888 | A1* | 3/2019 | Ko | H01L 21/0217 |
| 2019/0148151 | A1* | 5/2019 | Okuno | H01L 21/28088 257/401 |
| 2019/0224628 | A1* | 7/2019 | Lin | B01D 71/02 |
| 2020/0006352 | A1* | 1/2020 | Avci | H01L 21/31116 |
| 2020/0075320 | A1* | 3/2020 | Li | H01L 21/0228 |
| 2020/0227532 | A1* | 7/2020 | Greene | H01L 29/518 |
| 2020/0411662 | A1* | 12/2020 | Lin | H01L 29/516 |
| 2021/0057580 | A1* | 2/2021 | Chui | H01L 29/516 |
| 2021/0057581 | A1* | 2/2021 | Lin | H01L 29/66795 |
| 2021/0065996 | A1* | 3/2021 | Lin | H01G 11/32 |
| 2021/0082756 | A1* | 3/2021 | Tsai | H01L 21/76831 |

* cited by examiner

SELF-ALIGNED METAL COMPOUND LAYERS FOR SEMICONDUCTOR DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
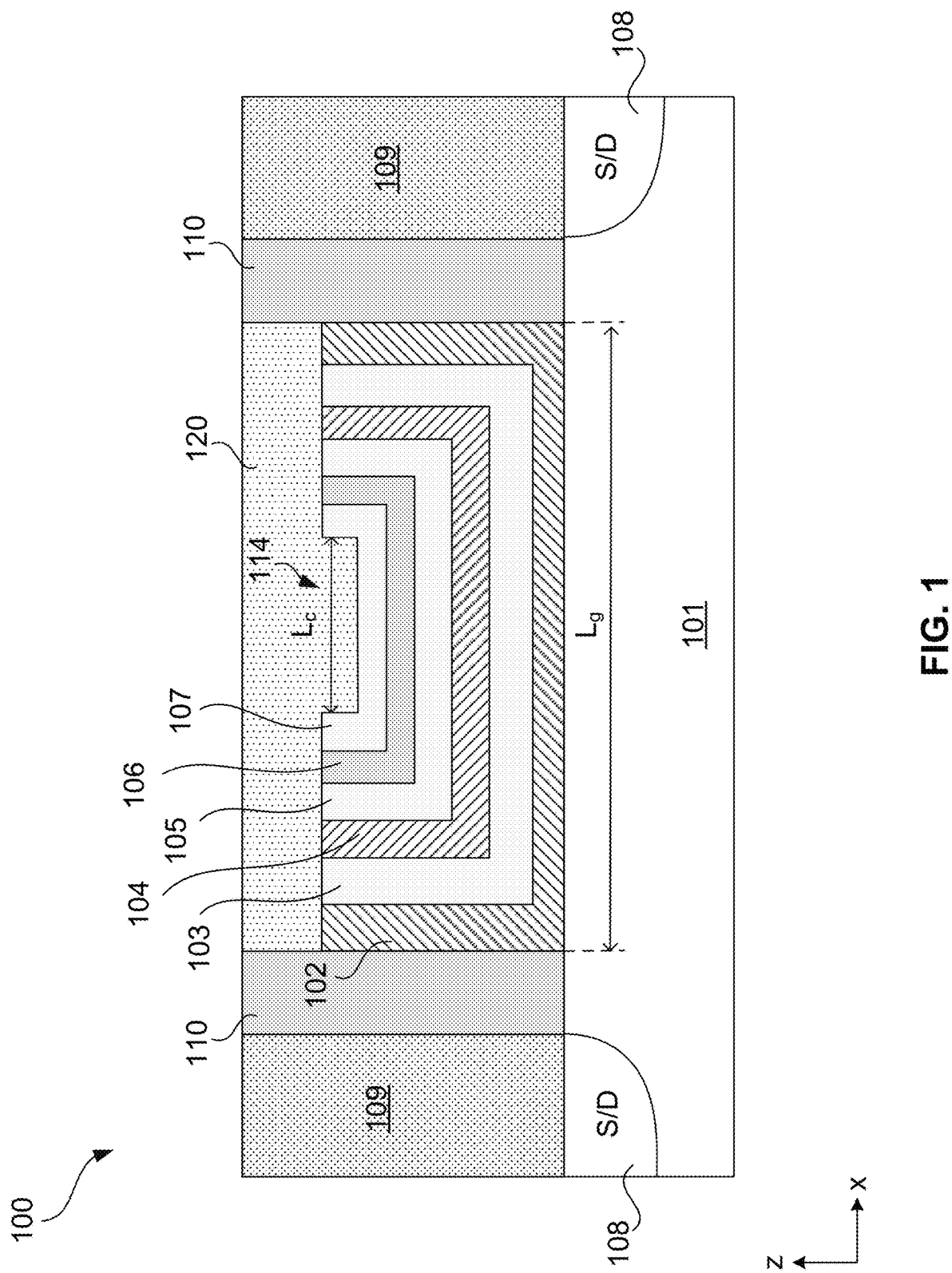
FIG. 1 is a cross-sectional view of a semiconductor device 100 incorporating crystalline ferroelectric dielectric material, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "finFET" refers to a FET that is formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, and ±5% of the value).

The terms "vertical direction" and "horizontal direction" respectively refer to z-direction and x-direction as illustrated in the figures herein.

The performance and scalability of silicon-based transistors are approaching limitations. For example, as device dimensions are scaled down to achieve higher packing density, shrinking silicon-based transistors becomes more challenging. A field effect transistor (FET) device may be used to address these challenges due to its compact form factor and improved performance, such as drive current enhancement and sub-threshold leakage reduction. FET devices can be metal-oxide-semiconductor FETs (MOSFETs).

A fin field effect transistor (finFET) utilizes a vertical device structure. Channel regions of the finFET are formed in fins that protrude from the substrate, and gate structures are disposed over sidewalls and top surfaces of the fins. Gate structures surrounding the channel provide the benefit of controlling the channel regions from, for example, three sides. Although finFETs may exhibit improved performance, they also have their challenges such as high subthreshold swing (SS). FETs incorporating a negative-capacitance (NC) technology (NCFETs) provides a feasible solution to lower power supply (e.g., VD) significantly and achieves a low SS for low power operation. SS generally describes the amount of voltage required to switch a device on and off and thus influences the operating speed of the device. Specifically, ferroelectric high-k dielectric materials have been employed to allow devices (e.g., FETs) to operate in a negative capacitance regime (e.g., in a negative-capacitance FET, or NCFET) for improved device performance. In one such example, ferroelectric high-k dielectric materials allow forming FETs with reduced SS. In many instances, other factors being constant, a reduction in SS generally increases a switching speed of an FET. SS can be controlled by the degree of ferroelectricity of a gate dielectric material included in a gate stack, with a higher ferroelectricity correlating to a lower SS. In addition, ferroelectric high-k dielectric materials can also enlarge the memory window for improved performance of nonvolatile memory devices. Notably, dielectric materials having similar compositions (e.g., all hafnium-based high-k dielectric material) may possess different degrees of ferroelectricity depending upon their specific crystalline phases (distinguished by different space groups, for example). In the example of hafnium-based high-k dielectric material, such as $HfO_2$, ferroelectric orthorhombic phase $Pca2_1$ possesses greater ferroelectricity than its counterpart orthorhombic phases.

Negative capacitance in an NCFET can be achieved by integrating ferroelectric capacitors. Specifically, in an NCFET, a negative capacitor having ferroelectric material is connected to a gate of a FET in series. The ferroelectric negative capacitor can be a separate capacitor connected by a conductive layer (e.g., wire/contact) to the gate of the FET. In some embodiments, one of the electrodes of the negative capacitor is a gate electrode of the MOSFET.

Suitable high-k dielectric materials (e.g., gate dielectric layers having a dielectric constant greater than 3.9) can be used as a gate dielectric layer in NCFETs. Hafnium-based high-k material can exhibit ferroelectric characteristics and are used in FETs to form NCFETs. While methods of producing hafnium-based high-k dielectric materials with enhanced ferroelectricity (e.g., orthorhombic phase $Pca2_1$) have generally been adequate, they have not been entirely satisfactory in all respects, especially as devices continue to decrease in size.

Various embodiments in accordance with this disclosure provide methods for forming a layer stack including one or more metal compound layers for improving threshold voltage tuning and enhancing performance of the ferroelectric layer in semiconductor devices. The gate stack can include one or more ferroelectric layers and metal compound layers formed in contact with the one or more ferroelectric layers for enhanced ferroelectricity and the capability to provide various threshold voltages across devices on the same wafer. In some embodiments, the metal compound layers can be metal oxide layers, such as lanthanum oxide, aluminum oxide, and any other suitable metal oxide material. In some embodiments, the metal compound layer can be formed of other suitable non-metallic material, such as silicon oxide, and referred to as metal compound for simplicity. The gate stack can be self-aligned with an opening formed between opposing spacers by depositing a self-assembly monolayer (SAM) selectively on the spacers. The gate stack formed between the opposing SAM layers provides improved gate control. The contact surface between the gate electrode and underlying channel region is enlarged which provides various benefits, such as reduced contact resistance and improved device performance such as increased device speed.

The present disclosure describes embodiments directed to dielectric layers related to forming gate stack structures, which may be employed in multiple technology nodes and in a variety of device types. In some embodiments, a crystalline ferroelectric dielectric and methods for forming the same can be incorporated in technology nodes of 7 nm or less. For example, embodiments described herein may also be applied in 3 nm technology nodes. In some embodiments, embodiments of the disclosed gate stacks can be suitable for use in planar bulk metal-oxide-semiconductor field effect transistors (MOSFETs), multi-gate transistors (planar or vertical) such as finFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices. In addition, embodiments disclosed herein may be employed in forming p-type and/or n-type devices. Other semiconductor structures may also benefit from embodiments of the present disclosure, such as contacts and interconnects.

FIG. 1 shows a cross-sectional view of a semiconductor device 100 incorporating ferroelectric dielectric material, in accordance with some embodiments. In some embodiments, semiconductor device 100 is a planar MOS device. In some embodiments, semiconductor device 100 can be a vertical FET device. In some embodiments, semiconductor device 100 can be a NCFET device.

Semiconductor device 100 can include a metal gate electrode formed by a replacement gate process. Metal gate electrodes are used in scaled planar and finFET-based devices for improved circuit performance. For example, metal gate electrodes can replace polysilicon gate electrodes to achieve reduced gate leakage and improved drive current. One process of implementing metal gates is termed a "gate last" or "replacement gate" process. Such processes include forming a sacrificial polysilicon gate, performing various processes associated with the semiconductor device, removing the sacrificial gate to form a trench or opening, and depositing metal gate material in the trench or opening to form the metal gate electrode.

As shown in FIG. 1, a gate stack is formed between opposing surfaces of ILD 109 and a top surface of semiconductor substrate 101. In FIG. 1, an interface layer 102, a first metal compound layer 103, a high-k dielectric layer 104, a second metal compound layer 105, a ferroelectric layer 106, a third metal compound layer 107, and a gate electrode 120 are collectively referred to herein as "a metal gate stack" and is positioned over a semiconductor substrate 101. Spacer 110 is formed on sidewalls of the metal gate stack to facilitate a subsequent source/drain alignment operation. In some embodiments, in addition to the layers described above, semiconductor device 100 may further include liner layers, seed layers, adhesion layers, barrier layers, or their equivalents.

A pair of source/drain (S/D) 108 is formed in the semiconductor substrate 101, and a distance between the source and the drain of S/D 108 is gate length $L_g$. In some embodiments, the gate length $L_g$ of semiconductor device 100 can be about 16 nm, less than 16 nm, or greater than 16 nm. In some embodiments, gate length Lg can depend on the technology node. In some embodiments, p-type or n-type work function layers can be formed between gate electrode 120 and substrate 101 to provide various threshold voltages for semiconductor device 100. S/D 108 can be doped with p-type or n-type dopants depending on the device type being formed and are not described in detail herein for simplicity.

Semiconductor substrate 101 can be a bulk semiconductor substrate on which various layers and device structure are formed. In some embodiments, semiconductor substrate 101 can include silicon or a compound semiconductor, such as gallium arsenide (GaAs), indium phosphide (InP), silicon germanium (SiGe), silicon carbide (SiC), other suitable semiconductor materials, and/or combinations thereof. In some embodiments, various layers can be formed on semiconductor substrate 101, such as dielectric layers, doped layers, polysilicon layers, conductive layers, other suitable layers, and/or combinations thereof. In some embodiments, various devices can be formed on semiconductor substrate 101, such as transistors, resistors, capacitors, other suitable devices, and/or combinations thereof.

ILD 109 can include a dielectric material. In some embodiments, the dielectric material can include silicon oxide, silicon nitride, silicon oxynitride, spin-on glass (SOG), fluorinated silica glass (FSG), carbon doped silicon oxide (e.g., SiCOH), amorphous fluorinated carbon, Parylene, bis-benzocyclobutenes, polyimide, other proper porous polymeric materials, other suitable dielectric materials, and/or combinations thereof. In some embodiments, ILD 109 can include a high density plasma (HDP) dielectric material (e.g., HDP oxide) and/or a high aspect ratio process (HARP) dielectric material (e.g., HARP oxide). ILD 109 can also include one or more dielectric materials and/or one or more dielectric layers. ILD 109 can be planarized by a chemical-mechanical-polishing (CMP) process until a top portion of the gate stack is exposed. The CMP process includes a high selectivity to provide a substantially planar surface for the metal gate stack, spacers 110, and ILD 109. In some embodiments, the CMP process has low dishing and/or metal erosion effect.

Spacers 110 can be formed on opposing surfaces of ILD 109 and on surface of substrate 101. Spacers 110 can include a plurality of sub-spacers and are not illustrated in FIG. 1 for simplicity. Spacers 110 can be formed using dielectric material, such as silicon oxide, silicon nitride, silicon oxynitride, any other suitable dielectric material, and/or combinations of the same. Spacers 110 can be formed by blanket depositing a dielectric material and anisotropically etching the dielectric material such that the remaining dielectric material is formed on sidewalls of ILD 109.

Interface layer 102 can be formed on a top surface of substrate 101 and on sidewall surfaces of spacers 110, thus forming a u-shaped cross-sectional profile as illustrated in FIG. 1. Interface layer 102 can include a dielectric material, such as silicon oxide or silicon oxynitride. Interface layer 102 can be formed by chemical oxidation, thermal oxidation, atomic layer deposition (ALD), chemical vapor deposition (CVD), any other suitable deposition methods, and/or combinations thereof. In some embodiments, interface layer 102 can be formed by a blanket deposition process followed by an etch-back process. In some embodiments, interface layer 102 can be optional.

First metal compound layer 103 can be formed on interface layer 102. Therefore, first metal compound layer 103 can also take the form of a u-shaped cross-sectional profile. First metal compound layer 103 can be used to adjust the threshold voltage of semiconductor device 100 and can be a work function layer. In some embodiments, first metal compound layer 103 can be an n-type work function layer or a p-type work function layer. For example, an n-type FET can include both p-type as well as n-type work function metal and more than one work function layer, or the n-type FET can include only one type of work function metal. In some embodiments, first metal compound layer 103 can be a metal oxide compound. For example, first metal compound layer 103 can be formed of lanthanum oxide, aluminum oxide, yttrium oxide, any other suitable metal compound material, and/or combinations thereof. In some embodiments, first metal compound layer 103 can be formed of other suitable non-metallic oxide material, such as silicon oxide, and referred to as metal compound layer for simplicity. Exemplary p-type work function materials include, but are not limited to, titanium nitride, tantalum nitride, ruthenium, molybdenum, tungsten nitride, zirconium silicide, molybdenum silicide, tantalum silicide, nickel silicide. Exemplary n-type work function metals include, but are not limited to, titanium, silver, aluminum, tantalum aluminide, tantalum aluminide carbide, titanium aluminide nitride, tantalum carbide, tantalum carbide nitride, tantalum silicon nitride, manganese, zirconium. The work function layer can be deposited by chemical vapor deposition (CVD), physical vapor deposition (PVD), atomic layer deposition (ALD), any suitable process, and/or combinations thereof.

High-k dielectric layer 104 can be deposited on first metal compound layer 103. In some embodiments, high-k dielectric layer 104 is a thin film having dielectric constant greater than about 3.9. In some embodiments, high-k dielectric layer 104 can be formed of hafnium oxide, titanium oxide, hafnium zirconium oxide, $Ta_2O_3$, $HfSiO_4$, $ZrO_2$, $ZrSiO_2$, or combinations thereof. High-k dielectric layer 104 can be formed by CVD, ALD, PVD, e-beam evaporation, any suitable process, and/or combinations thereof. Alternatively, high-k dielectric layer 104 can include metal oxide materials. Examples of metal oxides used for high-k dielectrics include oxides of hafnium, neodymium, lithium, magnesium, ytterbium, and/or compounds thereof. High-k dielectric layer 104 can be formed by CVD, ALD, PVD, and/or other suitable methods. In some embodiments, high-k dielectric layer 104 can be formed by a blanket deposition process followed by an etch-back process.

Second metal compound layer 105 can be formed on high-k dielectric layer 104. Similar to first metal compound layer 103, second metal compound layer 105 can be used to adjust the threshold voltage of semiconductor device 100. Second metal compound layer 105 can be formed using materials similar to first metal compound layer 103. For example, second metal compound layer 105 can be formed using lanthanum oxide, aluminum oxide, yttrium oxide, zirconium oxide, hafnium oxide, any other suitable metal compound material, and/or combinations thereof. In some embodiments, both first and second metal compound layers 103 and 105 can be n-type work function layers. In some embodiments, first and second metal compound layers 103 and 105 can be work function layers having opposite types of conductivity.

Ferroelectric layer 106 can be a suitable material having ferroelectric properties. For example, ferroelectric layer 106 can include a high-k dielectric, such as a hafnium-based oxide material. In some embodiments, ferroelectric layer 106 can include hafnium dioxide ($HfO_2$). Other suitable crystalline ferroelectric dielectric material can be used. In some embodiments, ferroelectric layer 106 can be a crystallized hafnium-based oxide material with orthorhombic phase. Ferroelectric layer 106 can be formed by any suitable process, such as ALD, CVD, metalorganic CVD (MOCVD), physical vapor deposition (PVD), plasma enhanced CVD (PECVD), plasma enhanced ALD (PEALD), thermal oxidation, any other suitable deposition techniques, and/or combinations thereof. As shown in FIG. 1, ferroelectric layer 106 is formed on second metal compound layer 105 and can also follow a similar u-shaped cross-sectional profile.

Third metal compound layer 107 can be formed on ferroelectric layer 106. Similar to first and second metal compound layers 103 and 105, third metal compound layer 107 can be used to adjust the threshold voltage of semiconductor device 100. Third metal compound layer 107 can be formed using materials similar to first or second metal compound layers 103 and 105. For example, third metal compound layer 107 can be formed using lanthanum oxide, aluminum oxide, yttrium oxide, zirconium oxide, hafnium oxide, any other suitable metal compound material, and/or combinations thereof. In some embodiments, third metal compound layer 107 can be an n-type work function layer. In some embodiments, third metal compound layer 103 and 105 can be a p-type work function layer. As shown in FIG. 1, third metal compound layer 107 is formed on ferroelectric layer 106 and can also follow a similar u-shaped cross-sectional profile. The u-shaped third metal compound layer 107 can form an opening 114 between opposing sidewalls of the u-shaped structure. Opening 114 can have an opening width $L_c$ along a horizontal (e.g., x-direction) between about 4 nm and about 8 nm. A ratio $R_1$ of opening width $L_c$ over gate length $L_g$ (i.e., $R_1 = L_c/L_g$) can be between about 0.2 and about 0.4. A greater $R_1$ value not only provides lower contact resistance between a gate electrode and third metal compound layer 107 but also provides improved gate control. However, the u-shaped cross-sectional structures of layers from interface layer 102 to third metal compound layer 107 reduces width $L_c$ and the $R_1$ value is usually to be less than about 0.4.

Gate electrode 120 is formed on third metal compound layer 107 to form a metal gate stack. Gate electrode 120 can include any metal material suitable for forming a metal gate or portion thereof. For example, gate electrode 120 can include tungsten. In some embodiments, gate electrode 120 can be formed using tungsten nitride (WN), TaN, ruthenium, silver, aluminum, any other suitable material, and/or combinations thereof. In some embodiments, gate electrode 120 can be formed using a damascene process followed by a planarization process (e.g., a CMP process) to remove any excessive material formed on the top surface of ILD 109.

Figure 2:
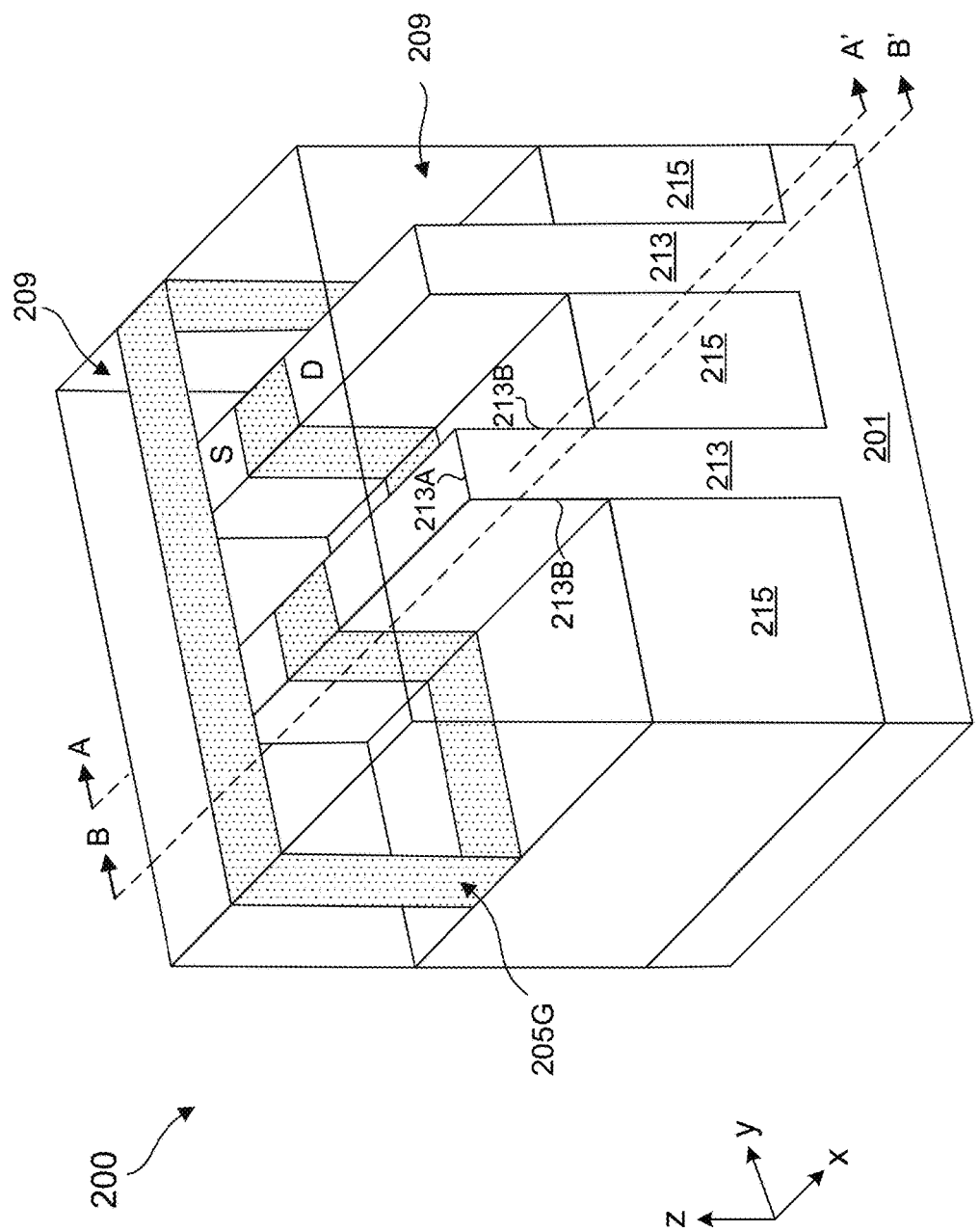
FIGS. 2 and 3A-3B are various views of a finFET structure, in accordance to some embodiments.
Figure 3A:
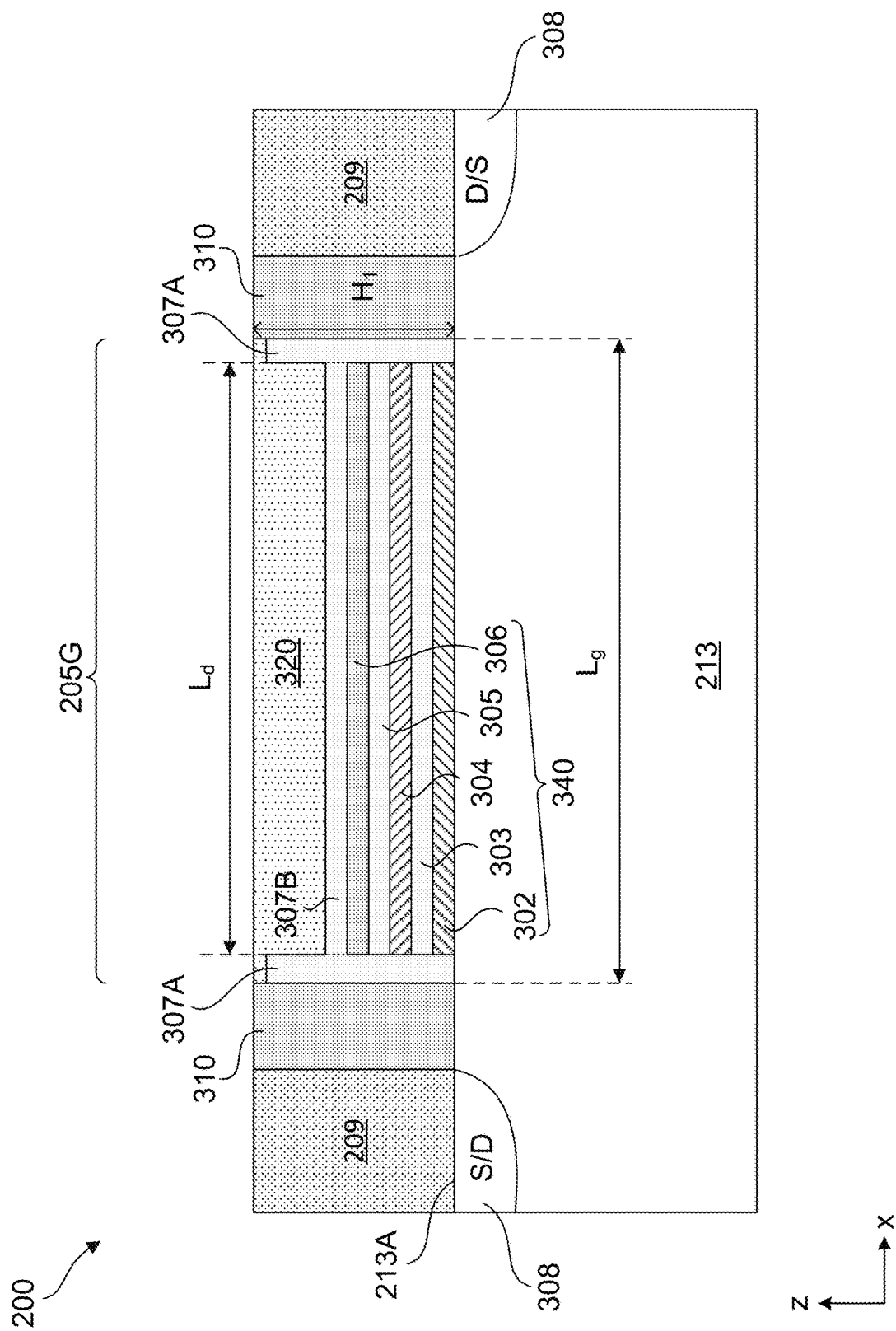
Figure 3B:
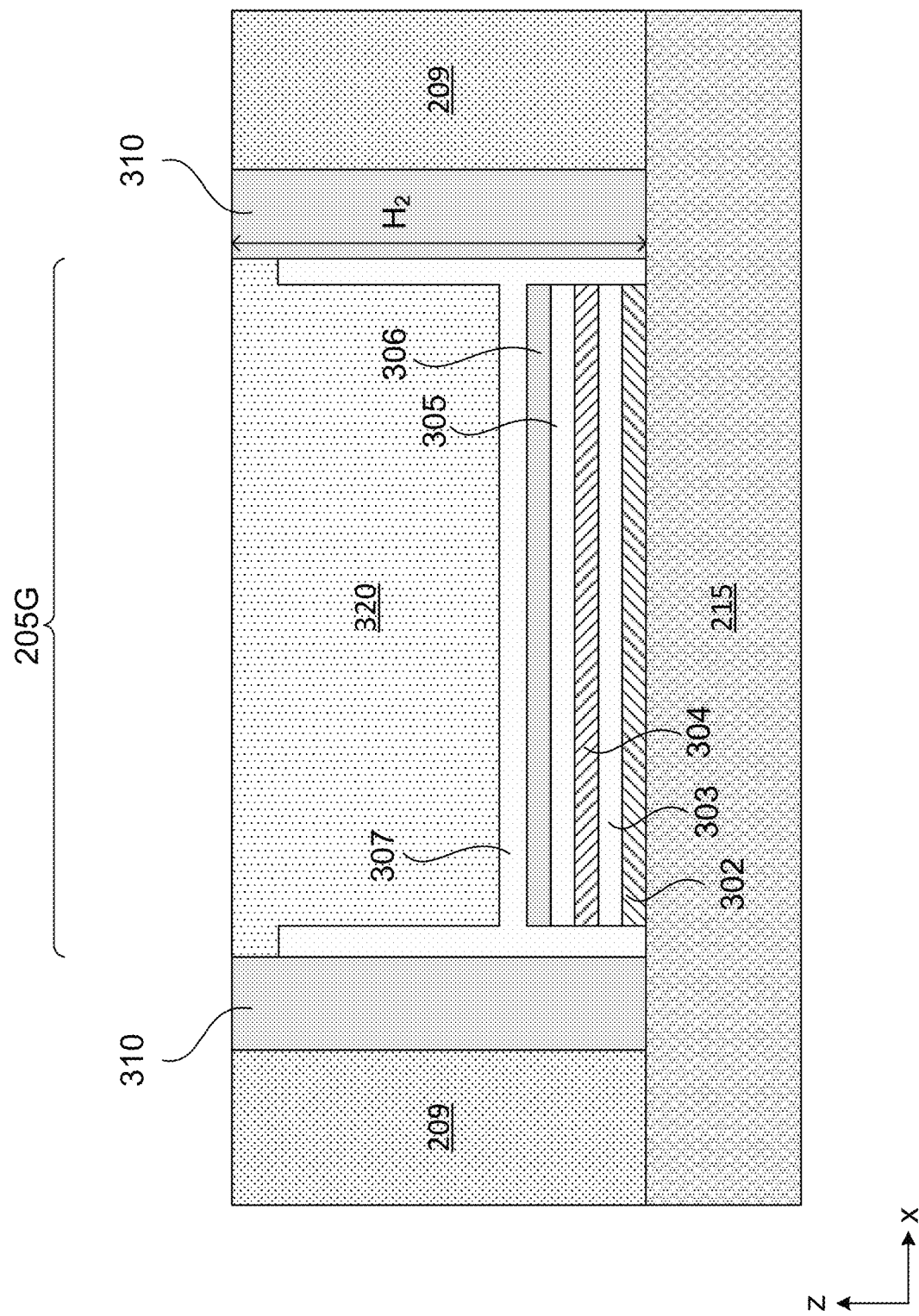

FIGS. 2 and 3A-3B illustrate various views of a finFET structure 200. As further described in FIGS. 3A-3B, finFET structure 200 can include substrates, fins formed on substrates, interlayer dielectric layers, interface layers, high-k dielectric layers, metal compound layers, electrode layers, and other suitable layers. As an example, finFET structure 200 illustrated in the present disclosure can be an n-type finFET having one or more n-type work function layers. In some embodiments, finFET can be a p-type finFET having one or more p-type work function layers. FinFET structure 200 can also include other suitable structures and are not illustrated in FIGS. 2 and 3A-3B for simplicity.

Referring to FIG. 2, a perspective view of finFET structure 200 is shown. Two semiconductor fins 213 are positioned on a substrate 201 and are separated by shallow trench isolation (STI) 215. Semiconductor substrate 201 can be a bulk semiconductor substrate on which various layers and device structures are formed. In some embodiments, semiconductor substrate 201 can be similar to semiconductor substrate 101 as described above in FIG. 1 and is not repeated here for simplicity. In some embodiments, semiconductor substrate 201 can be different from semiconductor substrate 101. In some embodiments, various layers and devices can be formed on semiconductor substrate 201. For example, dielectric layers, doped layers, polysilicon layers, conductive layers, other suitable layers, and/or combinations thereof. Multiple devices can be interconnected through an interconnect layer to additional integrated circuits. Semiconductor fin 213 can be formed of silicon, silicon-germanium, germanium, or other suitable semiconductor materials. A metal gate stack 205G is formed over top surface 213A and sidewalls 213B of semiconductor fins 213. A channel of finFET structure 200 (not shown) is defined along a top surface 213A and sidewalls 213B of semiconductor fin 213 and extended between source/drain (S and D) in the semiconductor fin 213. As shown in FIG. 2, ILD 209 is formed over top surface 213A and sidewalls 213B at the S/D portions of the semiconductor fins 213. STI 215 is formed on substrate 201 and between adjacent semiconductor fins 213. Metal gate can be formed using a replacement gate process where a sacrificial polysilicon gate structure is removed from ILD 209, leaving an opening where a metal gate structure can be deposited. In some embodiments, the opening can be a high aspect ratio opening having an aspect ratio between about 6 and about 60. Spacers can be formed between metal gate stack 205G and ILD 209 and are not shown in FIG. 2 for simplicity.

FinFET structure 200 can include a high-k dielectric layer and a ferroelectric layer for providing negative capacitance characteristic and metal compound layers for enhancing the negative capacitance and adjusting threshold voltages. In some embodiments, the ferroelectric layer can also have a high dielectric constant and acts as a high-k dielectric layer. The metal compound layers can extend in the horizontal direction (e.g., y-direction), thus enlarging the contact area between the metal gate electrode and the underlying channel region, as further described below in FIGS. 3A-3B.

Referring to FIGS. 3A-3B, two cross-sectional views of finFET structure 200 are shown. The cross section shown in FIG. 3A is viewed from a first direction of finFET structure 200 of FIG. 2. The first direction is cut through semiconductor fin 213 and parallel to a longitudinal axis of semiconductor fin 213 and is denoted as "A-A'." The cross section shown in FIG. 3B is viewed from a second direction of finFET structure 200 of FIG. 2. The second direction is through STI 215 and also parallel to a longitudinal axis of semiconductor fin 213 and is denoted as "B-B'." Gate stack 205G is formed on top surface 213A of semiconductor fin 213 as shown in FIG. 3A or top surface of STI 215 as shown in FIG. 3B. Spacers 310 are formed on sidewalls of gate stack 205G to facilitate a subsequent source/drain alignment operation and/or gate stack 205G formation. S/D 308 and spacer 310 can be respectively similar to S/D 108 and spacer 110 described above in FIG. 1 and are not described in detail here for simplicity.

In FIG. 3A, gate stack 205G is positioned on semiconductor fin 213. Gate stack 205G can include layer stack 340 and gate electrode 320. Layer stack 340 can include interface layer 302, first metal compound layer 303, high-k dielectric layer 304, second metal compound layer 305, ferroelectric layer 306, and third metal compound layer 307. A channel length $L_g$ is measured along top surface 213A of semiconductor fin 213 and extended between a source (S) and a drain (D) in semiconductor fin 213. In some embodiments, the channel length $L_g$ in finFET structure 200 is less than about 16 nm. In some embodiments, the channel length $L_g$ can be greater than about 16 nm. A height $H_1$ of gate stack 205G is a length measured from a leveled top surface of gate electrode 320 to top surface 231A of fin 213. In some embodiments, height $H_1$ of gate stack 205G can be from about 20 nm to about 120 nm.

Interface layer 302 can be formed on top surface 213A of fin 213, in accordance with some embodiments. Interface layer 302 can extend horizontally without being in contact with spacers 310. In some embodiments, interface layer 302 can include a dielectric material, such as silicon oxide or silicon oxynitride. Interface layer 302 can be formed by chemical oxidation, thermal oxidation, ALD, CVD, physical vapor deposition (PVD), plasma-enhanced CVD (PECVD), electron beam evaporation, any other suitable deposition methods, and/or combinations thereof. In some embodiments, interface layer 302 can be a conformal layer having substantially uniform thickness on top surface 213A of fin 213. In some embodiments, interface layer 302 has a thickness less than about 5 Å. For example, interface layer 302 can have a thickness between about 2 Å and about 5 Å. In some embodiments, thickness of interface layer 302 is about 3 Å. In some embodiments, interface layer 302 can be optional. Interface layer 302 can be similar to interface layer 102 described above in FIG. 1.

First metal compound layer 303 can be formed on interface layer 302. First metal compound layer 303 can be used to adjust the threshold voltage of finFET structure 200 and can be a work function layer. In some embodiments, first metal compound layer 303 can be an n-type work function layer or a p-type work function layer. For example, an n-type FET can include both p-type as well as n-type work function metal and more than one work function layer, or the n-type FET can include only one type of work function metal. In some embodiments, first metal compound layer 303 can be a metal oxide compound. In some embodiments, first metal compound layer 303 can be formed using similar material as first metal compound layer 103 described above in FIG. 1. In some embodiments, first metal compound layer 303 can be formed using ALD, CVD, PVD, PECVD, electron beam evaporation, any other suitable deposition methods, and/or combinations thereof. The thickness of first metal compound layer 303 can affect the threshold voltage of finFET structure 200. For example, the thickness of first metal compound layer 303 can be proportional to the change of threshold voltage. In some embodiments, a greater thickness of first metal compound layer 303 provides a greater adjustment of the threshold voltage at an approximate rate of 20-40 mV/Å. In some embodiments, the thickness of first metal compound layer 303 can be between about 2 Å and about 10 Å.

High-k dielectric layer 304 can be deposited on first metal compound layer 303. In some embodiments, high-k dielectric layer 304 is a thin film having dielectric constant greater than about 3.9. In some embodiments, high-k dielectric layer 304 can be formed of material similar to high-k dielectric layer 104 described above in FIG. 1. In some embodiments, high-k dielectric layer 304 can be formed by CVD, ALD, PVD, PECVD, e-beam evaporation, any suitable process, and/or combinations thereof. Alternatively, high-k dielectric layer 304 can include metal oxide materials similar to those that form high-k dielectric layer 104 and are not described here for simplicity.

Second metal compound layer 305 can be formed on high-k dielectric layer 304. Similar to first metal compound layer 303, second metal compound layer 305 can be used to adjust the threshold voltage of finFET structure 200. Second metal compound layer 305 can be formed using materials similar to first metal compound layer 305. In some embodiments, both first and second metal compound layers 303 and 305 can be n-type work function layers. In some embodiments, first and second metal compound layers 303 and 305 can be work function layers having opposite types of conductivity. For example, first and second metal compound layer 303 and 305 can be n-type and p-type work function layers respectively, or p-type and n-type work function layers respectively. Similar to first metal compound layer 303, the thickness of second metal compound layer 305 can also affect the threshold voltage of finFET structure 200. For example, the thickness of second metal compound layer 305 can be proportional to the change of threshold voltage. In some embodiments, a greater thickness of second metal compound layer 305 provides a greater adjustment of the threshold voltage at an approximate rate of 20-40 mV/Å. In some embodiments, the thickness of second metal compound layer 305 can be between about 2 Å and about 10 Å.

Ferroelectric layer 306 can be a suitable material having ferroelectric properties. For example, ferroelectric layer 306 can include a high-k dielectric such as a hafnium-based oxide material. In some embodiments, ferroelectric layer 306 can include hafnium dioxide ($HfO_2$). Other suitable ferroelectric dielectric material can be used. In some embodiments, ferroelectric layer 306 can be a crystallized hafnium-based oxide material with orthorhombic phase. Ferroelectric layer 306 can be formed by any suitable process such as ALD, CVD, metalorganic CVD (MOCVD), PVD, PECVD, plasma enhanced ALD (PEALD), thermal oxidation, any other suitable deposition techniques, and/or combinations thereof. As shown in FIG. 3A, ferroelectric layer 306 is formed on second metal compound layer 305 and can also follow a similar horizontal cross-sectional profile.

Third metal compound layer 307 can be formed on ferroelectric layer 306 and also between spacers 310 and the stack of layers containing layers from interface layer 302 to ferroelectric layer 306. Specifically, third metal compound layer 307 includes first portions 307A formed along a sidewall of spacer 310 and in contact with a sidewall of each layer of the layer stack from interface layer 302 to ferroelectric layer 306. Third metal compound layer 307 also includes second portion 307B formed on a top surface of ferroelectric layer 306. In some embodiments, first portions 307A extend along sidewalls of spacer 310 and above a top surface of second portion 307B. As such, second and third metal compound layers 305 and 307 encapsulates ferroelectric layer 306 and can affect the electric field strength and distribution around ferroelectric layer 306 during the operation of finFET structure 200. The encapsulation can improve the performance of finFET structure 200 by enlarging a voltage window where the negative capacitance phenomenon exists which can reduce the base voltage needed for turning on finFET structure 200. Because second metal compound layer 305 is between ferroelectric layer 306 and underlying channel region formed in fin 213 whereas third metal compound layer 307 is formed over ferroelectric layer 306, second metal compound layer 305 has a greater effect on enhancing the negative capacitance phenomenon. Similar to first and second metal compound layers 303 and 305, third metal compound layer 307 can be used to adjust the threshold voltage of finFET structure 200. In addition, third metal compound layer 307 can be formed using materials similar to first or second metal compound layers 303 and 305 and its material composition is not described herein for simplicity. In some embodiments, both second and third metal compound layers 305 and 307 can be n-type work function layers. In some embodiments, second and third metal compound layers 305 and 307 can be work function layers having opposite types of conductivity. First portions 307A can extend above second portion 307B, and a separation La between opposing portions 307A can be between about 16 nm and about 19 nm. A ratio $R_2$ of separation La over gate length $L_g$ (i.e., $R_2=L_a/L_g$) can be between about 0.8 and about 0.9. A greater $R_2$ value can not only provide lower contact resistance between a gate electrode and third metal compound layer 307 but also provides improved gate control. Because layer stack including interface layer 302 through ferroelectric layer 306 of FIG. 3A extend in the horizontal direction (e.g., x-direction) rather than taking a u-shaped cross-section such as the layer stack including interface layer 102 through third metal compound layer 107 of FIG. 1, separation La can be greater than width $L_c$. Similar to first and second metal compound layers 303 and 305, the thickness of third metal compound layer 307 can also affect the threshold voltage of finFET structure 200. For example, the thickness of third metal compound layer 307 can be proportional to the change of threshold voltage. In some embodiments, a greater thickness of third metal compound layer 307 provides a greater adjustment of the threshold voltage at an approximate rate of 20-40 mV/Å. In some embodiments, the thickness of third metal compound layer 307 can be between about 2 Å and about 10 Å.

Gate electrode 320 can fill in the opening formed between opposing spacers 310. In some embodiments, gate electrode 320 can be formed on top surfaces of first portions 307A and between second portions 307B of third metal compound layer 307. A top surface of gate electrode 320 can be substantially coplanar (e.g., level) with top surfaces of ILD 209 and spacers 310 by performing a planarization process, such as a chemical mechanical polishing process, on the exposed top surfaces. Gate electrode 320 can be similar to gate electrode 120 as described above in FIG. 1 and is not described here in detail for simplicity. In some embodiments, gate electrode 320 can include tungsten. In some embodiments, gate electrode 320 can be formed using WN, TaN, ruthenium, silver, aluminum, any other suitable material, and/or combinations thereof. In some embodiments, gate electrode 320 can be formed using a damascene process followed by a planarization process to remove any excessive material formed on the top surface of ILD 209.

The cross section shown in FIG. 3B is cut from a second direction shown in FIG. 2. The second direction is cut through STI 215 and in parallel to a longitudinal axis of semiconductor fin 213 and is denoted as "B-B'." Elements with the same numeral labels in FIGS. 2, 3A, and 3B are directed to the same structure of materials and are not repeated here for simplicity. STI 215 can be used to provide electrical insulation between adjacent devices and can be formed using low-k dielectric material (e.g., dielectric material having dielectric constant lower than 3.9). A gate height $H_2$ in FIG. 3B is measured from a top surface of gate electrode 320 to a top surface of STI 215. In some embodiments, gate height H2 can be between about 15 nm and about 25 nm.

Figure 4:
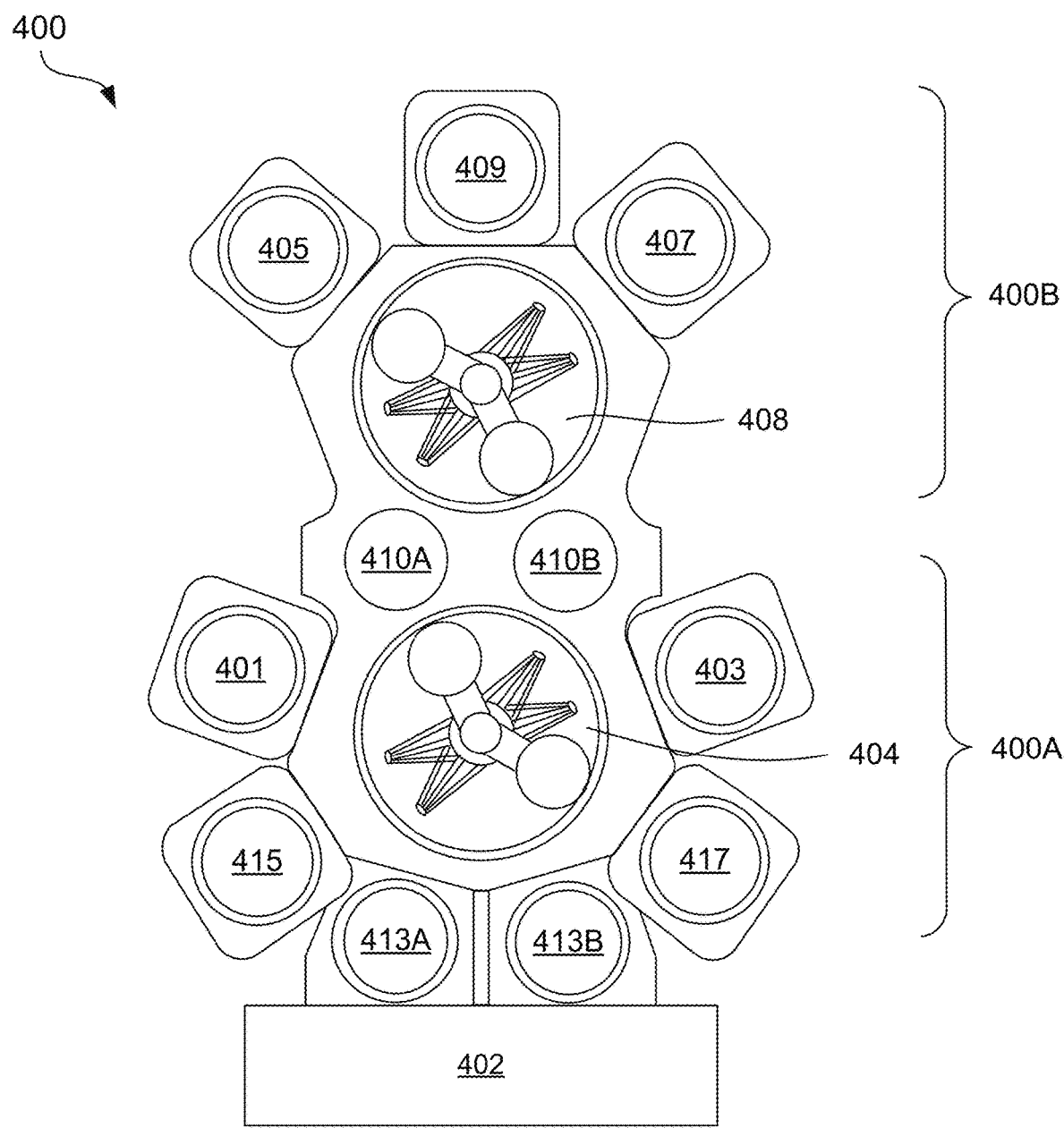
FIG. 4 is illustrates a semiconductor wafer manufacturing system in accordance with some embodiments.

FIG. 4 illustrates a configuration of a semiconductor wafer manufacturing system 400 used to form self-aligned metal compound layers in semiconductor devices. The semiconductor wafer manufacturing system 400 has preprocessing chambers, growth chambers, plasma treatment chambers, plasma etching chambers, and other suitable chambers arranged in two clusters 400A and 400B. Semiconductor wafer manufacturing system 400 may also include other chambers for depositing and processing dielectric layers, barrier layers, blocking layers, adhesion layers, anti-reflecting layers, and any other suitable layers that may be included in the semiconductor wafer. Each layer in the semiconductor devices described above in FIGS. 1-2 and 3A-3B can be formed in semiconductor wafer manufacturing system 400 without exposing the wafer to ambient contact between fabrication processes.

Two load lock chambers 413A and 413B are configured to receive a wafer transferred from a load port 402. Load lock chambers 413A and 413B are vented to a pressure equivalent to the load port 402 while a wafer is transferred between load port 402 and load lock chambers 413A or 413B. When moving the wafer from load lock chamber 413A or 413B into one of the chambers in semiconductor wafer manufacturing system 400, load lock chambers 413A and 413B are pumped down to a certain degree of vacuum that is closer to the vacuum level inside the clusters 400A and 400B. Clusters 400A and 400B each has at least one mechanical means such as a robot arm 404 or 408 which transfers the wafer parked in the pumped-down load lock chamber 413A or 413B to one of the growth chambers. Semiconductor wafer manufacturing system 400 can also include degassing chambers 415 and 417 that are used to activate and remove gaseous and/or liquid substances, such as moisture and oxygen from substrates to prevent change in thin film characteristics and cause deposition failure.

In some embodiments, a dielectric deposition chamber 401 is attached to cluster 400A and is loaded with precursors for dielectric layer growth. Interface layers 102 and 302 as illustrated in FIGS. 1 and 3A-3B can be deposited in dielectric deposition chamber 401 using any suitable deposition processes such as ALD, CVD, PECVD, PVD, other suitable deposition methods, and/or combinations thereof. As such, dielectric deposition chamber 401 can be any suitable corresponding deposition chambers and is not described in detail here.

In some embodiments, a deposition chamber 403 is attached to cluster 400A and is connected to precursor supplies for thin film growth. For example, deposition chamber can be used to deposit high-k dielectric material, ferroelectric material, metal compound material, self-assembly monolayer (SAM) material, and/or any other suitable material. In some embodiments, deposition chamber 403 can be loaded with precursors for depositing hafnium-based material to form high-k dielectric layers. For example, precursors such as hafnium tetrachloride ($HfCl_4$), water ($H_2O$), and any other suitable precursors are provided to deposition chamber 403. In some embodiments, the deposited high-k dielectric layer can have ferroelectric properties and can be a ferroelectric layer. In some embodiments, deposition chamber 403 can be loaded with precursors for depositing suitable metal oxide compounds. For example, precursors for depositing metal oxide compounds can include trimethylaluminium, Tris(isopropylcyclopentadienyl) lanthanum, Tris(ethylcyclopentadienyl) yttrium, and any other suitable precursors. In some embodiments, deposition chamber can be loaded with precursors for depositing SAM material. In some embodiments, precursors for depositing the SAM material can include octadecyltrichlorosilane ($CH_3(CH_2)_{17}SiCl_3$), tridecafluoro-1,1,2,2-tetrahydrooctyltrichlorosilane ($CF_3(CF_2)_5(CH_2)_2SiCl_3$) 1-octadecene ($CH_3(CH_2)_{15}(CH)CH_2$), and any other suitable precursors. The precursors can be in a gas form.

Deposition chamber 403 can be operated with or without activated plasma. In some embodiments, deposition chamber 403 can be an ALD deposition chamber, a CVD chamber, a PECVD chamber, a PVD chamber, or any other suitable chambers. In some embodiments, deposition chamber 403 can be maintained at a nominal temperature for thin film growth. For example, deposition chamber 403 can be set to a temperature between room temperature and about 200° C. In some embodiments, deposition chamber 403 can be maintained at a temperature between about 200° C. and about 1000° C. In some embodiments, deposition chamber 403 can be set to a chamber pressure nominal for high-k material growth. For example, deposition chamber 403 can be maintained at a chamber pressure between about 1 Torr and about 20 Torr. In some embodiments, deposition chamber 403 can be connected to supplies for precursors, such as hafnium tetrachloride, water, argon, nitrogen, and any other suitable precursors.

Treatment chambers 405 and 407 are attached to cluster 400B and are capable of performing various treatments for structures deposited on a semiconductor wafer. For example, treatment chambers 405 and 407 can be capable of performing an annealing process, a plasma treatment process, and any other suitable process. Treatment chambers 405 and 407 can be connected to supplies for precursors, such as nitrogen, argon, ammonia, oxygen, hydrogen, water, and any other suitable precursors. The precursors can be supplied to treatment chambers at nominal adjustable flow rates and/or mixing ratios. In some embodiments, treatment chambers can provide suitable plasma treatments to semiconductor wafers. For example, plasma treatments can be adjusted to suitable radio frequency (RF) power levels, such as between about 500 W and about 2500 W. In some embodiments, RF power levels can be between about 500 W and about 1000 W, between about 1000 W and about 1800 W, or between about 1800 W and about 2500 W. In some embodiments, the RF power can be other ranges suitable for the structures formed on a semiconductor wafer.

Etching chamber 409 can be a plasma etching chamber suitable for performing etching processes on semiconductor wafers. Precursors can be supplied to etching chamber 409 for suitable etching processes. For example, etching chamber 409 can be loaded with precursors for oxide compound etching, nitride compound etching, chloride compound etching, metal etching, any suitable plasma etching process, and/or combinations thereof.

In some embodiments, cooling chambers 410A and 410B allow a wafer to cool to a desired temperature at an appropriate cooling rate in between various thin film processing without ambient contact. In some embodiments, additional chambers can be included in semiconductor wafer manufacturing system 400 for depositing any suitable material used to form the semiconductor structures described above in FIGS. 1-2 and 3A-3B. For example, metal layer deposition chambers can be included in semiconductor wafer manufacturing system 400 for depositing gate electrodes 120 and 320 that fills the gate trench. Metal layer deposition chambers can be connected to precursor supplies, such as tungsten or cobalt target and can be introduced with argon gas.

During deposition of thin film layers in the deposition chambers of semiconductor wafer manufacturing system 400, the deposition chambers are kept under vacuum between each fabrication process, such that no ambient contact or contamination is introduced. A recipe can be entered into a computer processor (e.g., by an operator) to control the deposition chamber for performing film deposition process, treatment process, etching process, and other suitable processes. For example, the recipe can include deposition parameters for precursors in the film deposition process or treatment process, such as pulsing time, purging time, gas flow rate, chamber temperature, chamber pressure, plasma power, substrate bias, and/or any suitable deposition parameters. The recipe can also include processing parameters for film deposition and treatment process, such as precursor types, precursor flow rate, chamber pressure, chamber temperature, processing time, and/or any suitable processing parameters. Therefore, the process for forming high-k dielectric layer and other processes can be controlled by a recipe (e.g., a single recipe) in the same semiconductor wafer manufacturing system 400.

Each wafer is assigned with a sequence of operations according to an operating recipe to achieve automatic wafer processing in semiconductor wafer manufacturing system 400. In some embodiments, a substrate is first transferred from load lock chamber 413A and/or 413B to cluster 400A using robot arm 404. The wafer can be sent into chamber 415 or 417 for degassing and then to dielectric deposition chamber 401 for interface layer deposition. For example, interface layers 102 and 302 described above can be deposited in gate trenches using deposition chamber 401. In some embodiments, interface layers 102 and 302 are optional. In some embodiments, after an interface layer is formed, the wafer can be then transferred from deposition chamber 401 to deposition chamber 403 for the growth of first metal compound layer 103 or 303. In some embodiments, when an interface layer is not deposited the wafer can be transferred from load lock chamber 413A and/or 413B to deposition chamber 403. After a stack of layers is deposited, the wafer can be transferred to one of the treatment chamber 407 or 409 for any suitable subsequent treatment processes if needed. For example, the wafer can be transferred to treatment chamber 407 for an anneal treatment. In some embodiments, the wafer can be transferred to suitable etching and deposition chambers for subsequent etching and deposition processes. For example, the wafer can be transferred to deposition chamber 403 for metal layer deposition. The processing sequence described here is exemplary, and some steps can be omitted, added, and/or revised based on device design and requirements.

Figure 5:
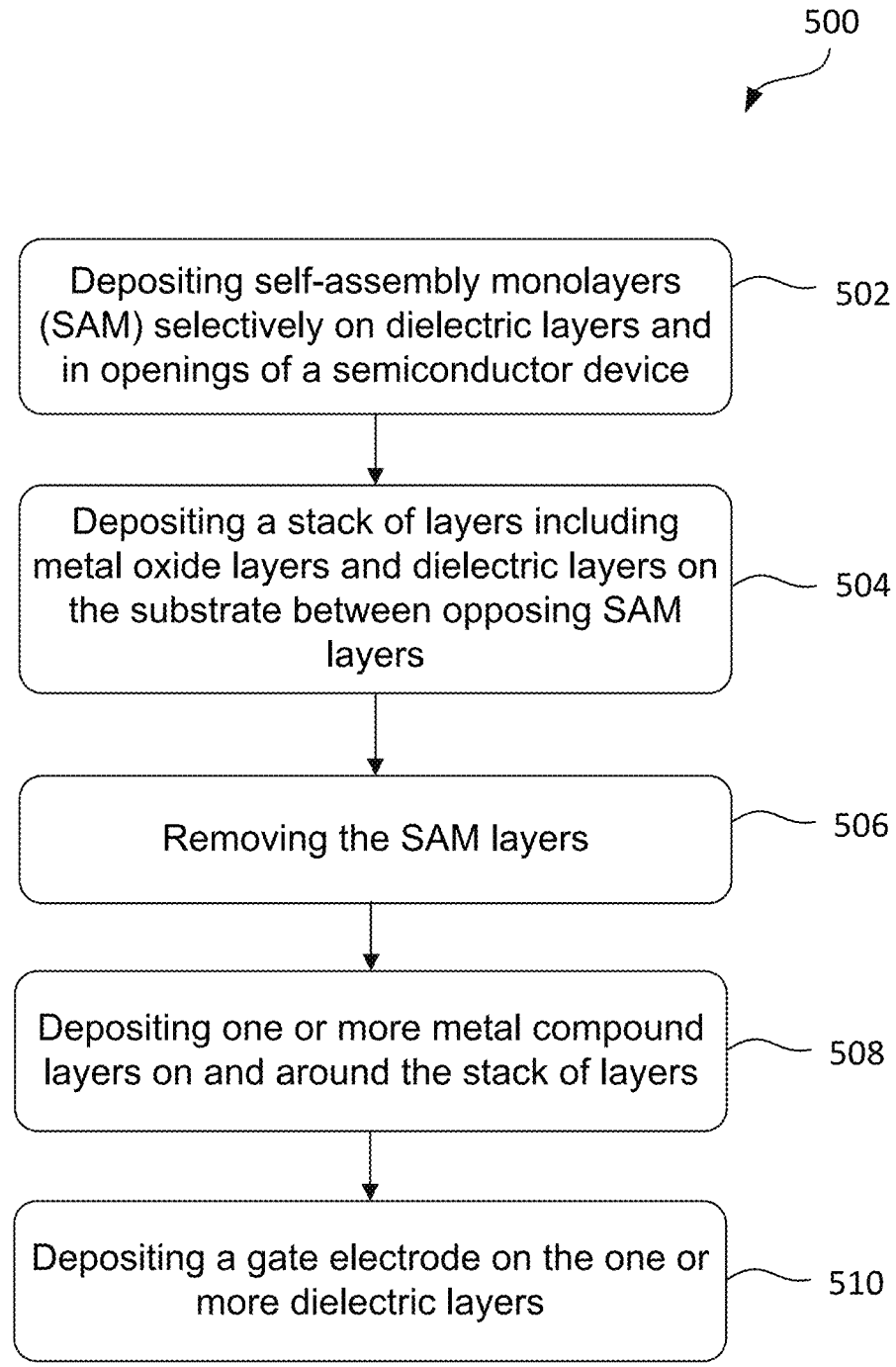
FIG. 5 is a flow diagram of a method for forming layers using multi-cycle deposition and etching processes, in accordance with some embodiments.

FIG. 5 is a flow diagram of an exemplary method 500 for forming self-aligned metal compound layers in semiconductor devices, in accordance with some embodiments of the present disclosure. The semiconductor device can include ferroelectric layers. Operations of method 500 can be performed in a different order and/or vary, and method 500 may include more operations and are not described for simplicity. FIGS. 6A-6E are provided as exemplary cross-sectional views to facilitate in the explanation of method 500.

FIGS. 6A-6E are cross-sectional views of fabricating an exemplary semiconductor structure 600 incorporating self-aligned metal compound layer stacks. Semiconductor structure 600 can include a S/D 608, an ILD 609, a spacer 610, a fin 613, and a top surface 613A, which are respectively similar to S/D 108, ILD 209, spacer 310, fin 213, and top surface 213A as described above in FIGS. 1-2 and 3A-3B and are not described in detail here for simplicity. In some embodiments, fin 613 can be a portion of a semiconductor substrate. Although fabrication processes of planar devices and/or finFET are described here as examples, the fabrication process can be applied in various semiconductor structures, such as trenches or gaps with low or high aspect ratios, finFETs, and any other suitable semiconductor structure. The fabrication processes provided here are exemplary, and alternative processes in accordance with this disclosure may be performed that are not shown in these figures.

At operation 502, self-assembly interface layers are selectively deposited on dielectric layers and in openings of a semiconductor device, in accordance with some embodiments of the present disclosure. The opening can have a high aspect ratio (e.g., greater than 6). The opening can be gate trenches and other suitable high aspect ratio openings. In some embodiments, the openings can be formed between opposing spacers and expose a top surface of a substrate. In some embodiments, the opening can expose a top surface of a fin formed as a portion of a substrate.

Figure 6A:
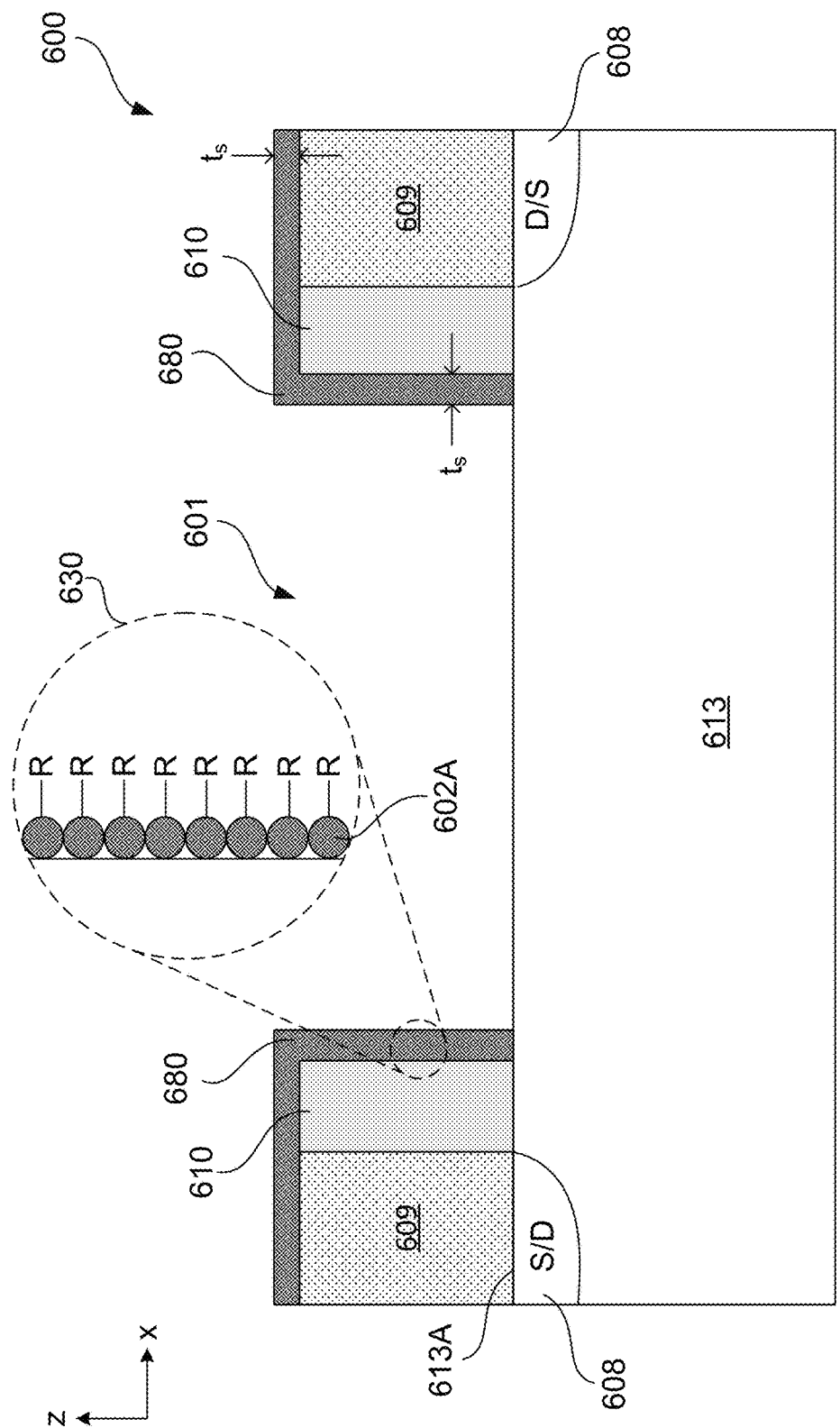
FIGS. 6A-6E are cross-sectional views of semiconductor structures, in accordance with some embodiments.

Referring to FIG. 6A, a SAM layer 680 is deposited in a gate trench 601 that is formed between exposed sidewalls of spacers 610 and on top surface 613A of fin 613. SAM layer 680 is selectively deposited on dielectric surfaces and over a portion of fin top surface 613A. In some embodiments, SAM layer 680 can be in contact with the portion of top surface 613A due to the growth initiated from sidewalls of spacer 610. A SAM layer is an organized layer of molecules that can be tailored such that one end of the molecule, a "head group," shows an affinity for dielectric surfaces and an aversion for fin surfaces. The head group is connected to an alkyl chain in which a tail or "terminal end" can be functionalized, for example, to vary wetting and interfacial properties. The head group is connected to a "terminal end" (a functional group) through a chain. In some embodiments, affinity and aversion characteristics can be achieved for a wide range of surfaces by choosing different compound types of head groups. As shown in the enlarged illustration 630 of SAM layer 680, SAM layer 680 includes an organized layer of molecules in which one end of the molecule, the head group 602A, shows a specific affinity for dielectric layers and an aversion for fin surfaces. SAM layer 680 also includes terminal ends R which can be functional groups selected based on device needs. In some embodiments, head group 602A can be selected to show different affinity or aversion for different surfaces, depending on the needs and device designs. In some embodiments, the compound types of head group 602A is selected such that it shows a specific affinity for dielectric surfaces and an aversion for specific silicon-containing material. For example, during deposition head group 602A can be attracted to ILD 609 and/or spacers 610 formed using dielectric materials, such as silicon oxide, spin-on-glass, silicon nitride, silicon oxynitride, silicon oxycarbide, silicon carbide, FSG, organosilicate, low-k dielectric material, and/or other suitable insulating material. In contrast, head group 602A is not attracted to fin 613 which can be portions of a substrate formed using IV-, II-VI-, III-V-group materials, such as silicon, silicon germanium, other suitable materials, and/or combinations thereof. Specifically, due to surface selectivity of head group 602A, SAM layer 680 can be formed on exposed surfaces of ILD 609 and spacers 610 but not on fin 613. For example, head group 602A can be attracted to the dangling OH bonds of the surfaces of ILD 609 and spacers 610 and form covalent bonds through condensation reactions, in accordance with some embodiments. Therefore, the surface selectivity of SAM layer 680 provides the benefit that SAM layers can be selectively deposited on desired surfaces. In some embodiments, terminal group R is selected such that it shows an aversion for dielectric material or metal compound material. In some embodiments, fin top surface 613A can be cleaned prior to the deposition of SAM layer 680 to enhance the growth selectivity. In some embodiments, the cleaning process can include immersing the wafer in dilute hydrofluoric acid, sulfuric peroxide mix, deionized water, and any other suitable solutions.

SAM layer 680 can formed using polymer-based material, pristine defect-free graphene material, other suitable SAM material, and/or combinations thereof. In some embodiments, SAM layer 680 be deposited using suitable processes, such as wet chemical solution, spin-on, CVD, PECVD, ALD, PEALD, and/or other suitable processes. The deposition of SAM layer 680 can be performed in a suitable chamber of a semiconductor wafer processing cluster tool. For example, SAM layer 680 can be formed in deposition chamber 403 of semiconductor manufacturing system 400 described above in FIG. 4. In some embodiments, SAM layer 680 has a thickness $t_s$ less than about 5 Å or between about 5 Å and about 10 Å. For example, SAM layer 680 can have a thickness that is a between about 5 Å and about 8 Å or between about 8 Å and about 10 Å. In some embodiments, thickness $t_s$ of SAM layer 680 is about 8 Å.

Figure 6B:
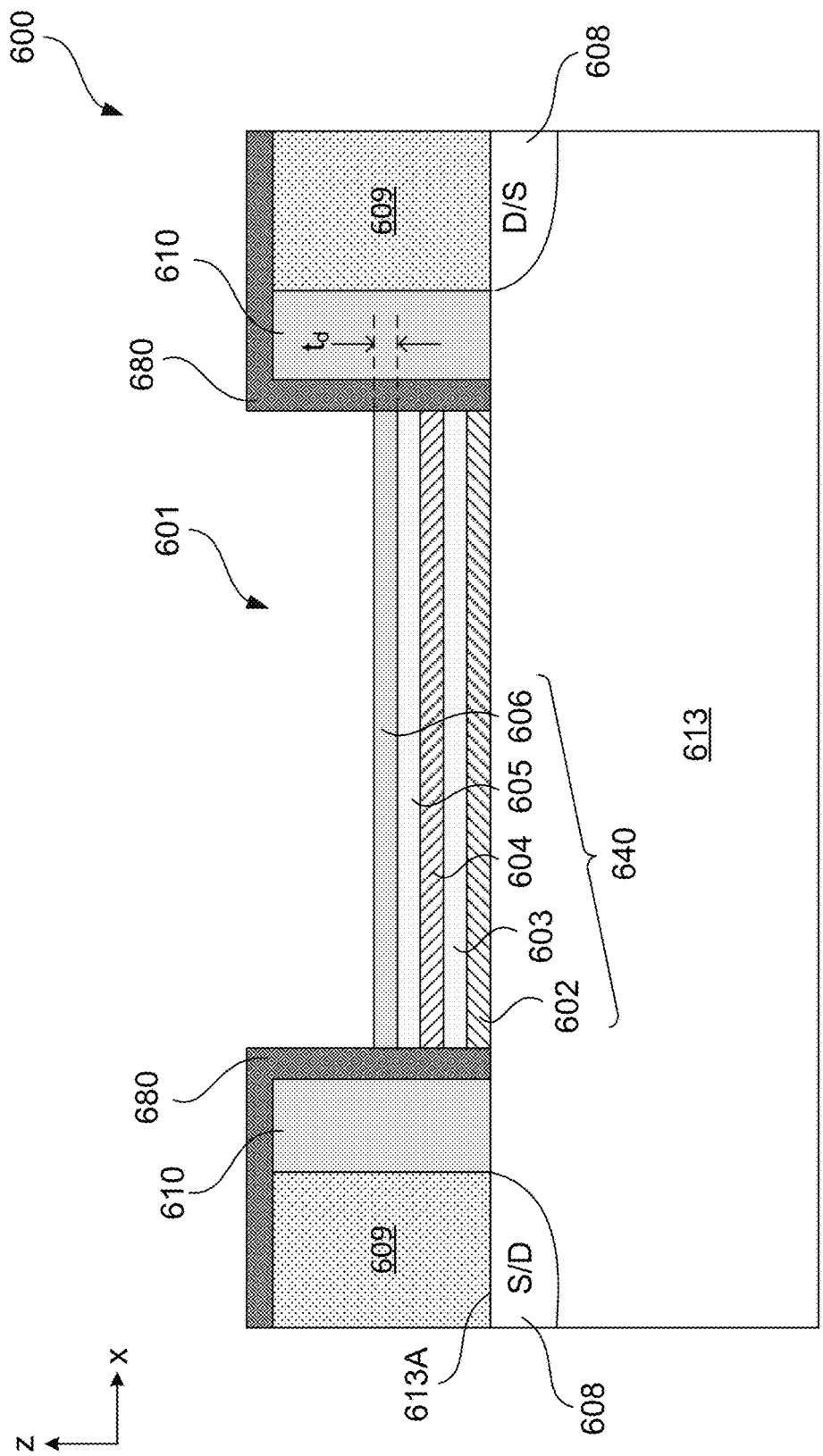

At operation 504, a stack of layers including metal oxide layers and dielectric layers are deposited on the substrate between opposing SAM layers. Referring to FIG. 6B, a layer stack 640 can include an interface layer 602, a first metal compound layer 603, a high-k dielectric layer 604, a second metal compound layer 605, and a ferroelectric layer 606, which are similar to their respective layers of layer stack 340 described above in FIG. 3A and are not described in detail here for simplicity. The layers of layer stack 640 deposited in an opening between opposing SAM layers 680 extend in the horizontal direction (e.g., x-direction) and are subsequently deposited one after another starting from depositing interface layer 602 on fin 613. Layer stack 640 is not deposited on SAM layer 680 as the terminal groups R of SAM layer 680 shows an aversion for dielectric material or metal compound material. However, layer stack 640 can be in contact with SAM layer 680 due to the growth processes that initiates from fin top surface 613A. Specifically, during deposition of each layer of layer stack 640, deposited material only accumulates at the bottom surface of gate trench 601 (e.g., fin top surface 613A) and does not adhere to SAM layer 680. As such, layer stack 640 is self-aligned to be formed between opposing SAM layers 680 without additional patterning or lithography processes. In some embodiments, each layer of layer stack 640 can be deposited using a substantially conformal blanket deposition method, such as an ALD process. In some embodiments, each layer can be formed by any suitable deposition method, such as CVD, PECVD, any other suitable deposition method, and/or combinations thereof. Thicknesses $t_d$ of each layer of layer stack 640 can be between about 10 Å and about 50 Å. The layers of layer stack 640 can have substantially the same thickness or the thicknesses $t_d$ can be different between the layers. For example, thickness $t_d$ of ferroelectric layer 606 can be in a range between about 10 Å and about 20 Å, between about 20 Å and about 30 Å, between about 30 Å and about 40 Å, between about 40 Å and about 50 Å, and any other suitable thicknesses. In some embodiments, thickness $t_d$ can be about 20 Å. The deposition of layers of layer stack 640 can be performed in a suitable chamber of a semiconductor wafer processing cluster tool, such as deposition chamber 403 of semiconductor manufacturing system 400 described above in FIG. 4.

Figure 6C:
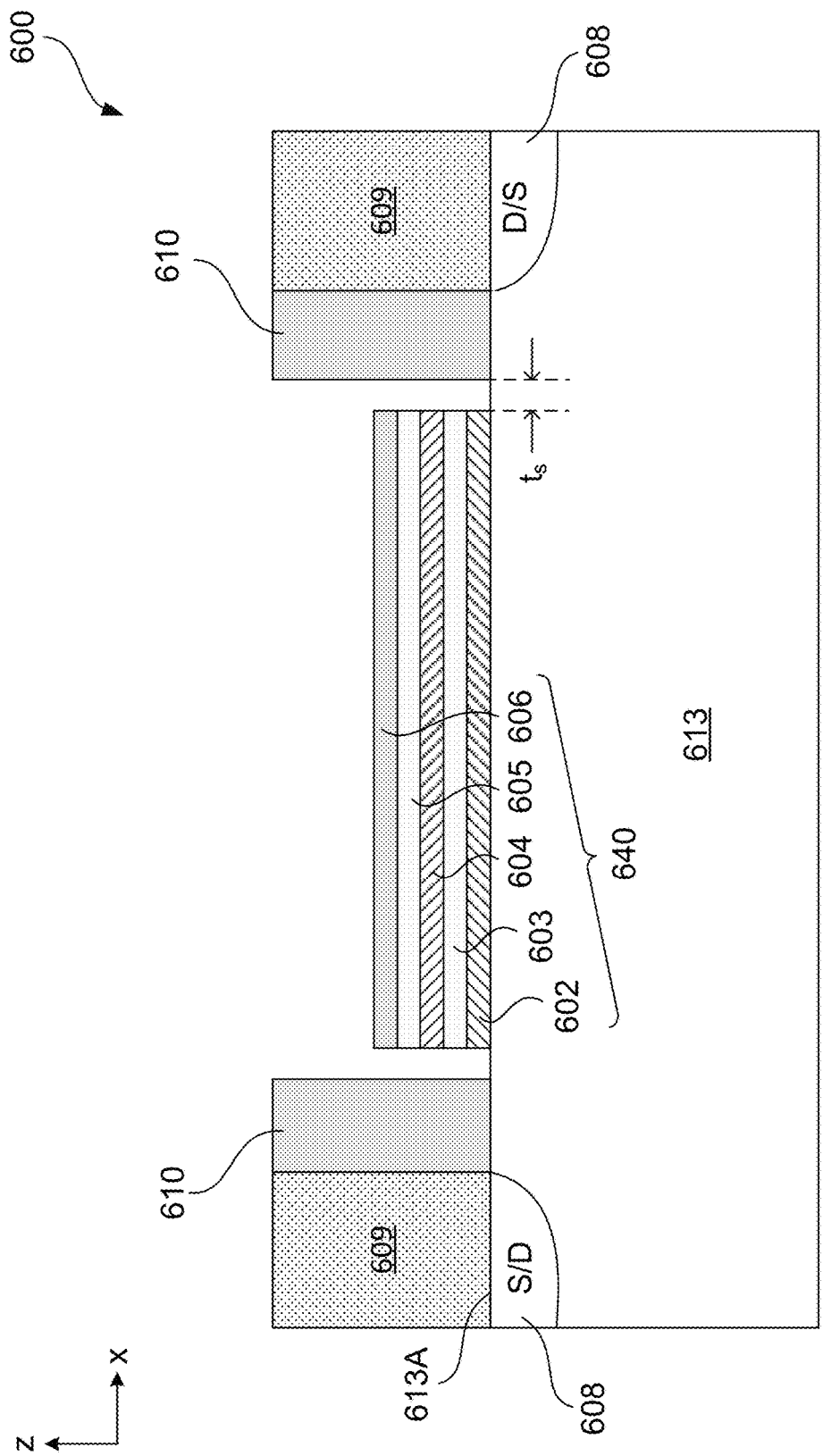

At operation 506, SAM layers are removed, in accordance with some embodiments of the present disclosure. Referring to FIG. 6C, SAM layers 680 can be removed by a dry etching processes using etching chamber 409 described above in FIG. 4. The removal process can be a plasma etching process using a gas etchant suitable for removing SAM layer 680. For example, SAM layer 680 can be formed using defect-free graphene material and the dry etching process can be loaded with precursors for etching carbon material while having a high selectivity (e.g., greater than about 10) against the materials that form layer stack 640. In some embodiments, SAM layer 680 can be removed by wet chemical etching using chemical etchants, such as hydrogen peroxide, ammonium hydroxide, any other suitable chemical etchants, and/or combinations thereof. For example, SAM layer 680 can be removed by a wet chemical bath of hydrogen peroxide and ammonium hydroxide. In some embodiments, SAM layer 680 can be removed by a nitrogen and hydrogen ashing process. In some embodiments, the removal process can be performed at a temperature range between about 50° C. and about 80° C. SAM layer 680 is removed and leaving gaps between layer stack 640 and spacers 610. The gaps also expose sidewalls of layer stack 640 and a portion of fin 613. SAM layer 680 is also removed from other surfaces of spacers 610 as well as ILD 609.

Figure 6D:
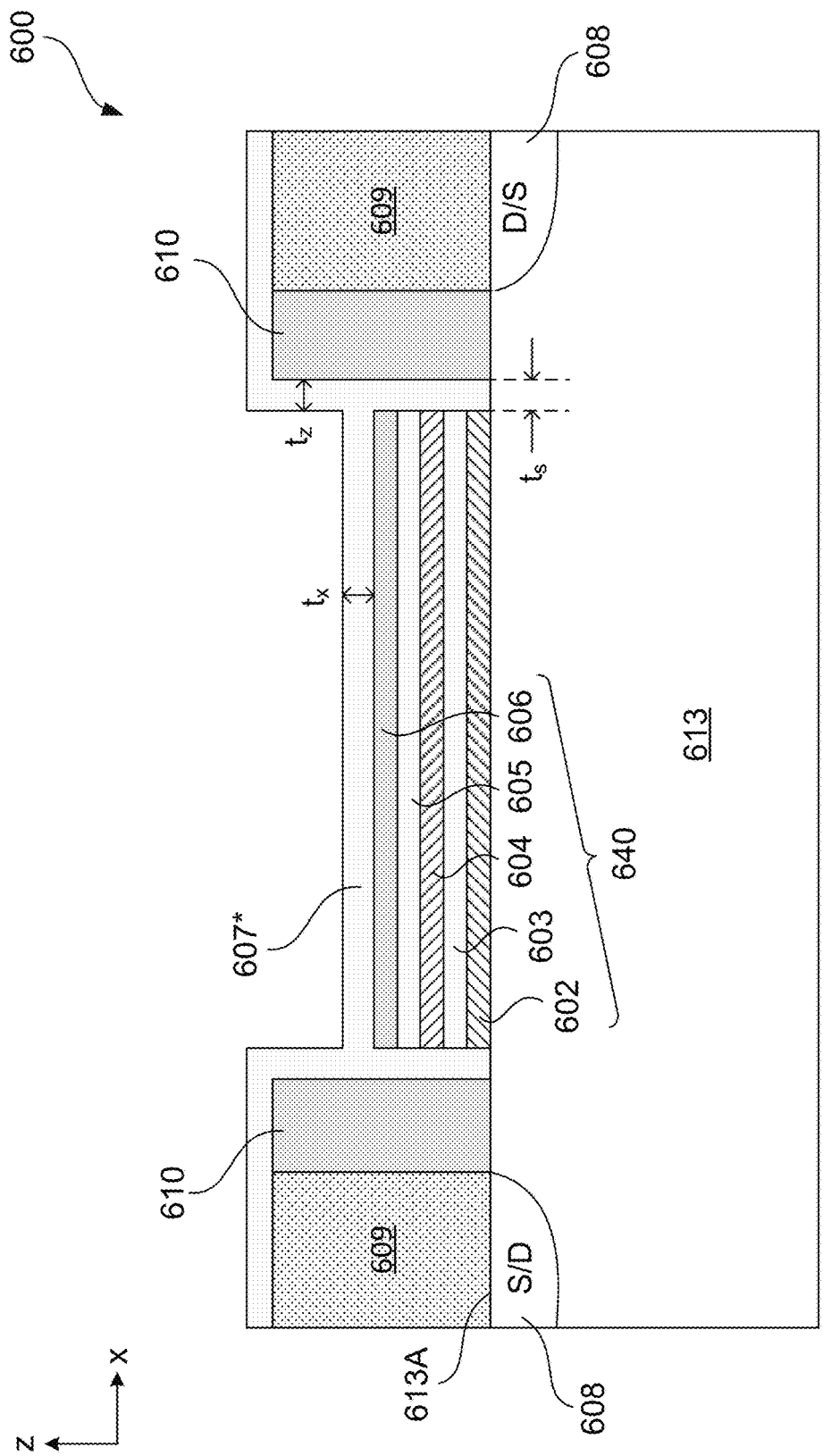
Figure 6E:
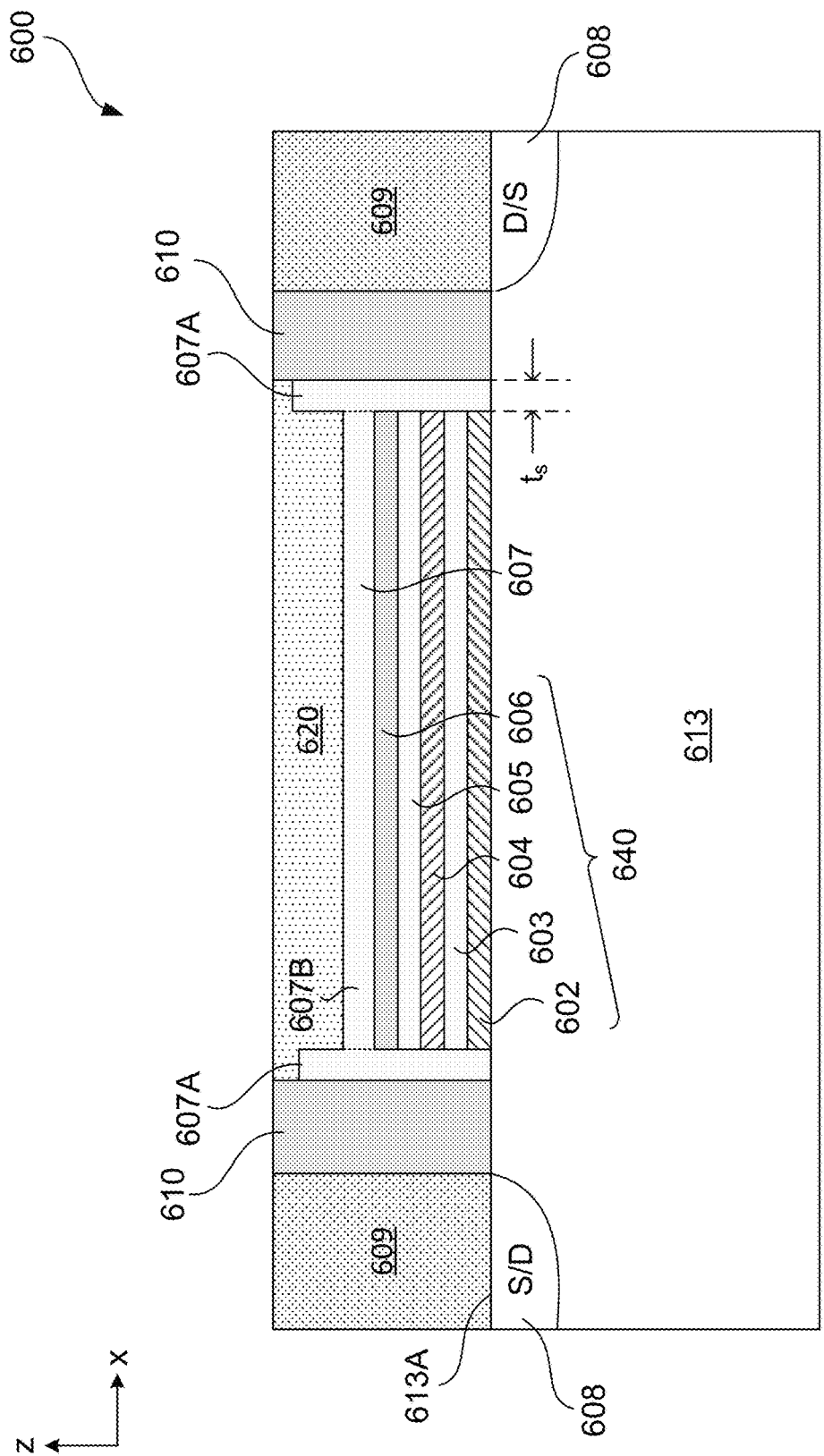

At operation 508, one or more metal compound materials are on and around the stack of layers, in accordance with some embodiments of the present disclosure. As shown in FIG. 6D, a third metal compound material 607* is blanket deposited on exposed surfaces of semiconductor structure 600, including a top surface of layer stack 640, gaps between layer stack 640 and spacers 610, top surfaces of ILD 609, exposed portions of fin 613, and sidewalls of spacer 610. In some embodiments, third metal compound material 607* fills the gaps that were left by removing SAM layer 680 from areas between layer stack 640 and spacers 610. As such, third metal compound material 607* is formed to surround layer stack 640 by being deposited on the layer stack's sidewall and top surfaces. In some embodiments, third metal compound material 607* includes portions formed on layer stack 640 that has thickness $t_x$ and portions formed on sidewalls of spacer 610 that has thickness $t_z$. In some embodiments, a ratio $R_3$ of $t_x$ over $t_z$ can be greater than about 3. For example, ratio $R_3$ can be about 5, about 7, about 10, or any suitable value. A greater $R_3$ value can provide greater protection of layer stack 640 under third metal compound material 607* from physical damage caused by subsequent fabrication processes. In some embodiments, third metal compound material 607* can be deposited using deposition chamber 403 described above in FIG. 4. In some embodiments, third metal compound material 607* can be formed using material similar to those that form third metal compound layer 307 and is not described here for simplicity.

At operation 510, gate electrodes are deposited in openings of a semiconductor device and a planarization process is performed, in accordance with some embodiments of the present disclosure. Prior to the deposition of gate electrode material, an etch back process can be used to etch back third metal compound material 607* to form third metal compound layer 607. After the etch back process, third metal compound layer 607 is formed on layer stack 640 and on sidewalls of spacers 610, similar to the structure of third metal compound layer 307 described above in FIG. 3A. For ease of description, referring to FIG. 6E, third metal compound layer 607 includes vertical portions 607A and horizontal portions 607B, and a gate electrode 620 is formed between opposing portions 607A and on horizontal portions 607B. Because SAM layer 680 has a thickness $t_s$ between layer stack 640 and spacer 610, first portion 607A also has a thickness $t_s$ that is between about 5 Å and about 10 Å. Gate electrode 620 can include tungsten, WN, TaN, ruthenium, silver, aluminum, any other suitable material, and/or combinations thereof. Gate electrode 620 can be formed using a damascene process followed by a planarization process to remove any excessive material. Examples of the planarization process can be a CMP process. Similar to finFET structure 200 described above in FIGS. 2 and 3A-3B, semiconductor device 600 described in FIG. 6E includes layer stack 640 that extends in the horizontal direction (e.g., x-direction) without having vertical (e.g., z-direction) portions, which provide the benefits of improved gate control, enlarged gate contact area, and flexible threshold voltage tuning.

Figure 7:
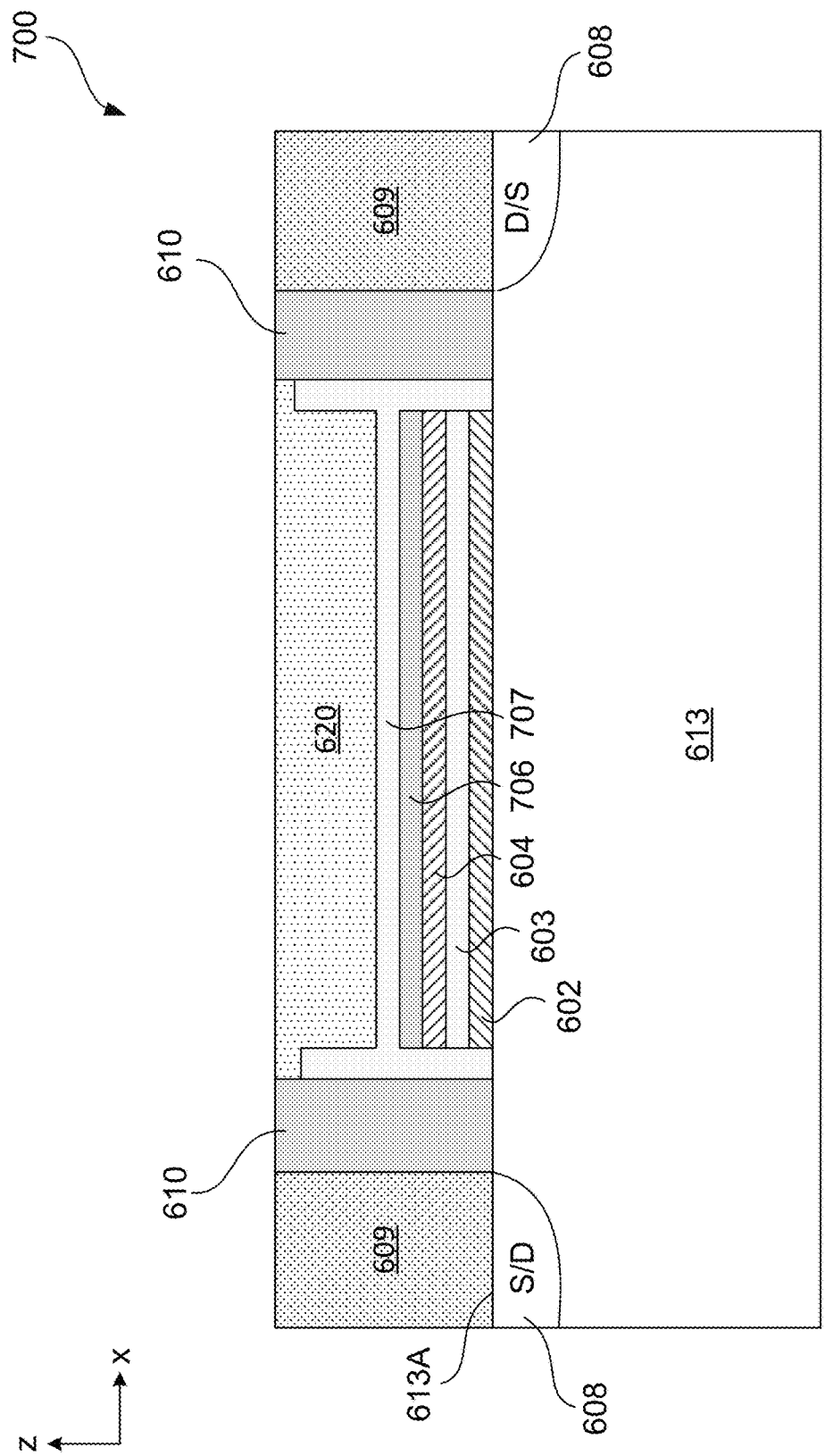
FIGS. 7-9 are cross-sectional views of semiconductor devices incorporating various metal compound layers, in accordance with some embodiments.
Figure 8:
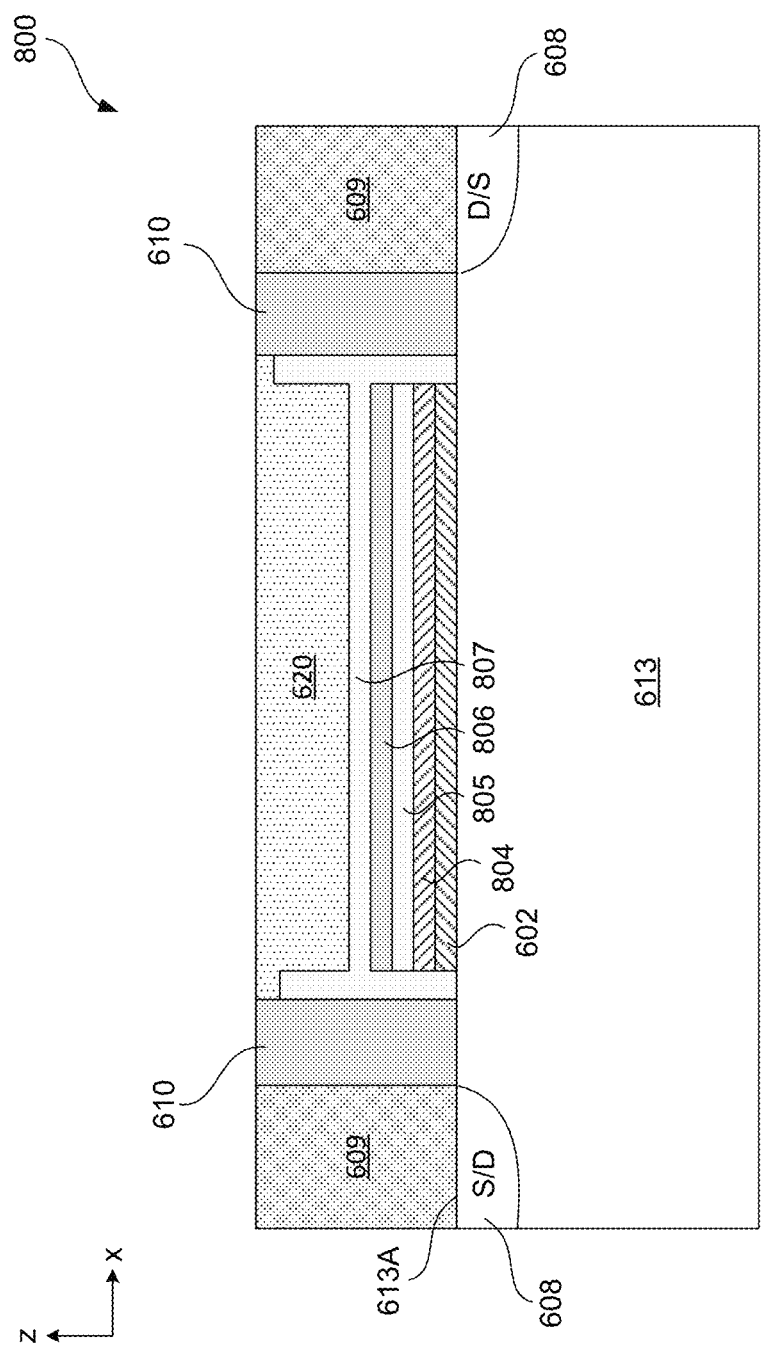
Figure 9:
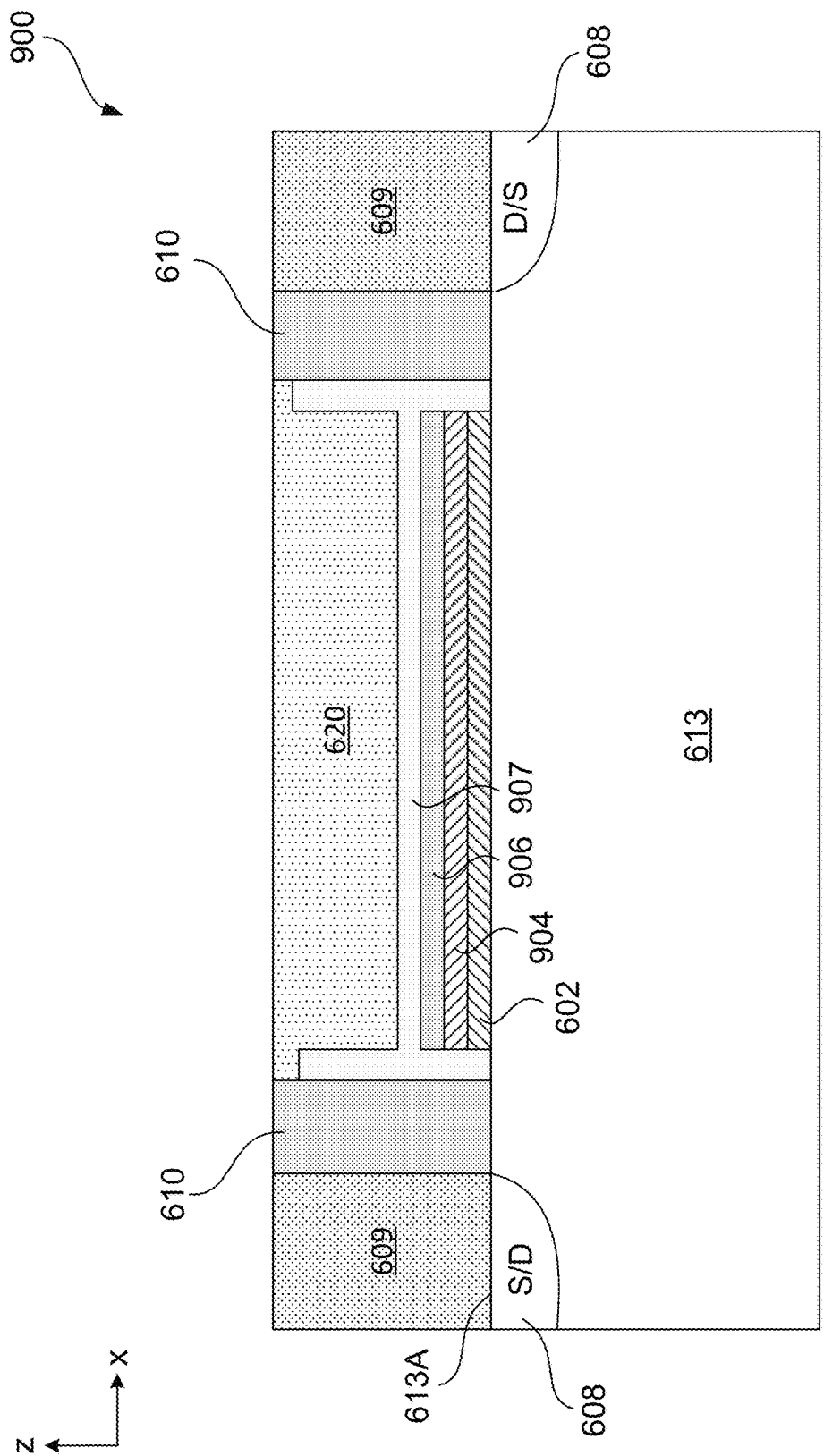

FIGS. 7-9 illustrate various configurations of semiconductor device incorporating self-aligned layer stack in semiconductor devices, according to some embodiments. Elements illustrated in FIGS. 7-9 that are similar to those illustrated in FIG. 6E share the same labeling numerical and are not described in detail for simplicity. Semiconductor devices illustrated in FIGS. 7-9 provide the benefits of, among others, improved gate control, enlarged gate contact area, and flexible threshold voltage tuning.

FIG. 7 illustrates a configuration of a self-aligned layer stack in a semiconductor device 700, according to some embodiments. Semiconductor device 700 includes a ferroelectric layer 706 that is formed (e.g., formed directly) on high-k dielectric layer 604. Similar to third metal compound layer 607 in FIG. 6E, a third metal compound layer 707 is deposited on ferroelectric layer 706, abutting spacers 610 and a layer stack including interface layer 602, first metal compound layer 603, high-k dielectric layer 604. Both first and third metal compound layers 603 and 707 provide threshold voltage tuning capabilities, and third metal compound layer 707 enhances ferroelectricity properties of ferroelectric layer 706 by enhancing an electric field above ferroelectric layer 706 during operation. In some embodiments, first and third metal compound layers 603 and 707 can provide sufficient voltage tuning of semiconductor device 700 without a second metal compound layer, which in turn reduces fabrication complexity and cost.

FIG. 8 illustrates a configuration of a self-aligned layer stack in a semiconductor device 800, according to some embodiments. Semiconductor device 800 includes interface layer 602 and a high-k dielectric layer 804 formed (e.g., formed directly) thereon. A second metal compound layer 805, a ferroelectric layer 806, and a third metal compound layer 807 are formed on high-k dielectric layer 804. In some embodiments, second and third metal compound layers 805 and 807 can provide sufficient voltage tuning of semiconductor device 800 without a first metal compound layer, which in turn reduces fabrication complexity and cost. Second and third metal compound layers 805 and 807 surround ferroelectric layer 806 by contacting opposing top and bottom surfaces and sidewall surfaces of ferroelectric layer 806, enhancing ferroelectric properties of ferroelectric layer 806.

FIG. 9 illustrates a configuration of a self-aligned layer stack in a semiconductor device 900, according to some embodiments. A high-k dielectric layer 904, a ferroelectric layer 906, and a third metal compound layer 907 are deposited on interface layer 602. In some embodiments, third metal compound layer 907 can provide sufficient voltage tuning of semiconductor device 900 without first and second metal compound layers, which in turn reduces fabrication complexity and cost. Third metal compound layer 907 can enhance ferroelectric properties of ferroelectric layer 906.

Various embodiments in accordance with this disclosure provide methods for forming a gate stack including one or more metal compound layers to improve threshold voltage tuning and enhancing performance of the ferroelectric layer in semiconductor devices. The gate stack can include one or more ferroelectric layers and metal compound layers formed in contact with the one or more ferroelectric layers for enhanced ferroelectricity and the capability to provide various threshold voltages across devices on the same wafer. The gate stack can be self-aligned with an opening formed between opposing spacers by depositing a SAM layer selectively on the spacers. The gate stack formed between the opposing SAM layers provides improved gate control. The contact surface between the gate electrode and underlying channel region can be enlarged which provides various benefits, such as reduced contact resistance and improved device performance including increased device speed.

In some embodiments a method for forming a semiconductor device includes forming a substrate and forming first and second spacers on the substrate. The method includes depositing first and second self-assembly (SAM) layers respectively on sidewalls of the first and second spacers and depositing a layer stack on the substrate and between and in contact with the first and second SAM layers. Depositing the layer stack includes depositing a ferroelectric layer and removing the first and second SAM layers. The method further includes depositing a metal compound layer on the ferroelectric layer. Portions of the metal compound layer are deposited between the ferroelectric layer and the first or second spacers. The method also includes depositing a gate electrode on the metal compound layer and between the first and second spacers.

In some embodiments a method for forming a semiconductor device includes forming a fin and forming a spacer on the fin. The method includes depositing a self-assembly (SAM) layer on a sidewall of the spacer and over a portion of the fin and depositing a layer stack on the fin and in contact with the SAM layer. The method further includes removing the SAM layer and exposing the portion of the fin. The method includes forming a first portion of a metal compound layer between the layer stack and the sidewall of the spacer. The first portion is in contact with the layer stack and the sidewall of the spacer. The method also includes forming a second portion of the metal compound layer on a top surface of the layer stack and depositing a gate electrode on the first and second portions of the metal compound layer.

In some embodiments, a semiconductor device includes a fin and a spacer on the fin. The semiconductor device also includes a layer stack on the fin and a metal compound layer. The metal compound layer includes a first portion in contact with a sidewall of the layer stack and a sidewall of the spacer. The metal compound also includes a second portion on a top surface of the layer stack. The semiconductor device also includes a gate electrode in contact with the first and second portions of the metal compound layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for forming a semiconductor device, comprising:
   forming a substrate;
   forming first and second spacers on the substrate;
   depositing first and second self-assembly (SAM) layers respectively on sidewalls of the first and second spacers;
   depositing a layer stack on the substrate and between and in contact with the first and second SAM layers, wherein depositing the layer stack comprises depositing a ferroelectric layer;
   removing the first and second SAM layers;
   depositing a metal compound layer on the ferroelectric layer, wherein portions of the metal compound layer are deposited between the ferroelectric layer and the first or second spacers; and
   depositing a gate electrode on the metal compound layer and between the first and second spacers.

2. The method of claim 1, wherein depositing the layer stack further comprises depositing another metal compound layer before depositing the ferroelectric layer.

3. The method of claim 1, wherein depositing the layer stack further comprises depositing a high-k dielectric layer before depositing the ferroelectric layer.

4. The method of claim 1, wherein depositing the layer stack further comprises:
   depositing an interface layer on the substrate; and
   depositing a high-k dielectric layer on the interface layer.

5. The method of claim 1, wherein depositing the metal compound layer comprises depositing a metal-based oxide material using atomic layer deposition (ALD).

6. The method of claim 1, wherein depositing the metal compound layer comprises:
   depositing a metal compound material; and
   performing an etch back process on the metal compound material.

7. The method of claim 1, further comprising performing a cleaning process on the substrate prior to depositing the first and second SAM layers.

8. The method of claim 1, wherein depositing the first and second SAM layers comprises depositing graphene.

9. The method of claim 1, wherein depositing the metal compound layer comprises depositing a metal compound material on the substrate and sidewalls of the ferroelectric layer.

10. The method of claim 1, wherein depositing the metal compound layer further comprises depositing a metal compound material on sidewalls of the layer stack.

11. A method for forming a semiconductor device, comprising:
    forming a fin;
    forming a spacer on the fin;
    depositing a self-assembly (SAM) layer on a sidewall of the spacer and over a portion of the fin;
    depositing a layer stack on the fin and in contact with the SAM layer;
    removing the SAM layer and exposing the portion of the fin;
    forming a first portion of a metal compound layer between the layer stack and the sidewall of the spacer, wherein the first portion is in contact with the layer stack and the sidewall of the spacer;
    forming a second portion of the metal compound layer on a top surface of the layer stack; and
    depositing a gate electrode on the first and second portions of the metal compound layer.

12. The method of claim 11, wherein depositing the layer stack comprises depositing a ferroelectric layer.

13. The method of claim 11, wherein forming the first portion of the metal compound layer comprises depositing a metal compound material on the portion of the fin.

14. The method of claim 11, wherein depositing the SAM layer comprises depositing graphene.

15. The method of claim 11, wherein depositing the metal compound layer comprises depositing a metal-based oxide material using atomic layer deposition (ALD).

16. A semiconductor device, comprising:
    a fin;
    a spacer on the fin;
    a layer stack on the fin, the layer stack comprising a ferroelectric layer;
    a metal compound layer, comprising:
        a first portion in contact with a sidewall of the layer stack and a sidewall of the spacer; and
        a second portion on a top surface of the layer stack; and a gate electrode in contact with the first and second portions of the metal compound layer.

17. The semiconductor device of claim 16, wherein the layer stack further comprises another metal compound layer.

18. The semiconductor device of claim 16, wherein the gate electrode is in contact with the spacer.

19. The semiconductor device of claim 16, wherein the first portion of the metal compound layer extends above a top surface of the second portion of the metal compound layer.

20. The semiconductor device of claim 16, wherein a thickness of the first portion between the sidewall of the layer stack and the sidewall of the spacer is between about 5 Å and about 10 Å.

* * * * *